(12) United States Patent
Yasusaka et al.

(10) Patent No.: US 10,348,079 B2
(45) Date of Patent: Jul. 9, 2019

(54) OVERCURRENT PROTECTIVE DEVICE, ELECTRONIC APPARATUS, INTEGRATED CIRCUIT, AND SIGNAL TRANSMISSION CIRCUIT

(71) Applicant: Rohm Co., Ltd., Kyoto (JP)

(72) Inventors: Makoto Yasusaka, Kyoto (JP); Daisaku Shugo, Kyoto (JP); Shinichi Hirata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 302 days.

(21) Appl. No.: 15/248,193

(22) Filed: Aug. 26, 2016

(65) Prior Publication Data

US 2017/0063074 A1 Mar. 2, 2017

(30) Foreign Application Priority Data

Aug. 27, 2015 (JP) .................. 2015-167696
Aug. 27, 2015 (JP) .................. 2015-167697
(Continued)

(51) Int. Cl.
*H02H 3/10* (2006.01)
*H03K 17/687* (2006.01)
(Continued)

(52) U.S. Cl.
CPC ....... *H02H 1/0007* (2013.01); *H01L 27/0255* (2013.01); *H01L 29/866* (2013.01);
(Continued)

(58) Field of Classification Search
CPC ...... H02H 1/0007; H02H 9/025; H02H 3/025; H02H 3/0935; H01L 27/0255; H01L 29/866; H03K 17/0822; H03K 17/145
USPC ............................................. 361/93.7
See application file for complete search history.

(56) References Cited

U.S. PATENT DOCUMENTS 4,414,601 A * 11/1983 Conroy, Jr. ............ H02H 3/044
361/97
4,852,680 A * 8/1989 Brown .................... B60R 25/23
180/287
(Continued)

FOREIGN PATENT DOCUMENTS

JP 2-241325 9/1990
JP 6-163841 6/1994
(Continued)

*Primary Examiner* — Zeev V Kitov
(74) *Attorney, Agent, or Firm* — Fish & Richardson P.C.

(57) ABSTRACT

The present overcurrent protective device comprises an input terminal configured to receive a power supply voltage, an output terminal, a switch, a detector, and a controller. The switch is provided between the input terminal and the output terminal. The detector is configured to output a limitation signal without delay when a current flowing through the switch exceeds a prescribed tolerance value. The controller is configured to receive the limitation signal and control the switch to prevent the current from exceeding the tolerance value. The detector is configured output a turn-off signal to the controller when a first state continues for a delay time determined depending on the current's magnitude. The first state is a state where the current is smaller than the tolerance value and the current exceeds a first threshold value smaller than the tolerance value. The controller turns off the switch in response to the turn-off signal.

17 Claims, 32 Drawing Sheets

| (30) | Foreign Application Priority Data |
|---|---|
| Aug. 27, 2015 (JP) | 2015-167698 |
| Aug. 27, 2015 (JP) | 2015-167699 |
| Aug. 27, 2015 (JP) | 2015-167700 |
| Jul. 19, 2016 (JP) | 2016-141587 |

(51) Int. Cl.
- *H02H 1/00* (2006.01)
- *H01L 27/02* (2006.01)
- *H01L 29/866* (2006.01)
- *H03K 17/082* (2006.01)
- *H03K 17/14* (2006.01)
- *H02H 3/093* (2006.01)
- *H02H 9/02* (2006.01)
- *H02H 3/02* (2006.01)

(52) U.S. Cl.
CPC .......... *H02H 3/0935* (2013.01); *H02H 9/025* (2013.01); *H03K 17/0822* (2013.01); *H03K 17/145* (2013.01); *H02H 3/025* (2013.01)

(56) References Cited

U.S. PATENT DOCUMENTS

| | | | |
|---|---|---|---|
| 5,276,582 A | 1/1994 | Merrill et al. | |
| 5,774,319 A * | 6/1998 | Carter | H02H 1/06 361/100 |
| 6,125,024 A * | 9/2000 | LeComte | H02H 3/025 361/104 |
| 2013/0099755 A1 | 4/2013 | Lei | |
| 2014/0265935 A1* | 9/2014 | Sadwick | H05B 33/0815 315/307 |
| 2015/0008732 A1 | 1/2015 | Fujimoto | |

FOREIGN PATENT DOCUMENTS

| JP | 2001-145338 | 5/2001 |
|---|---|---|
| JP | 2009-099641 | 5/2009 |
| JP | 2014-500700 | 1/2014 |
| JP | 2015-015643 | 1/2015 |

* cited by examiner

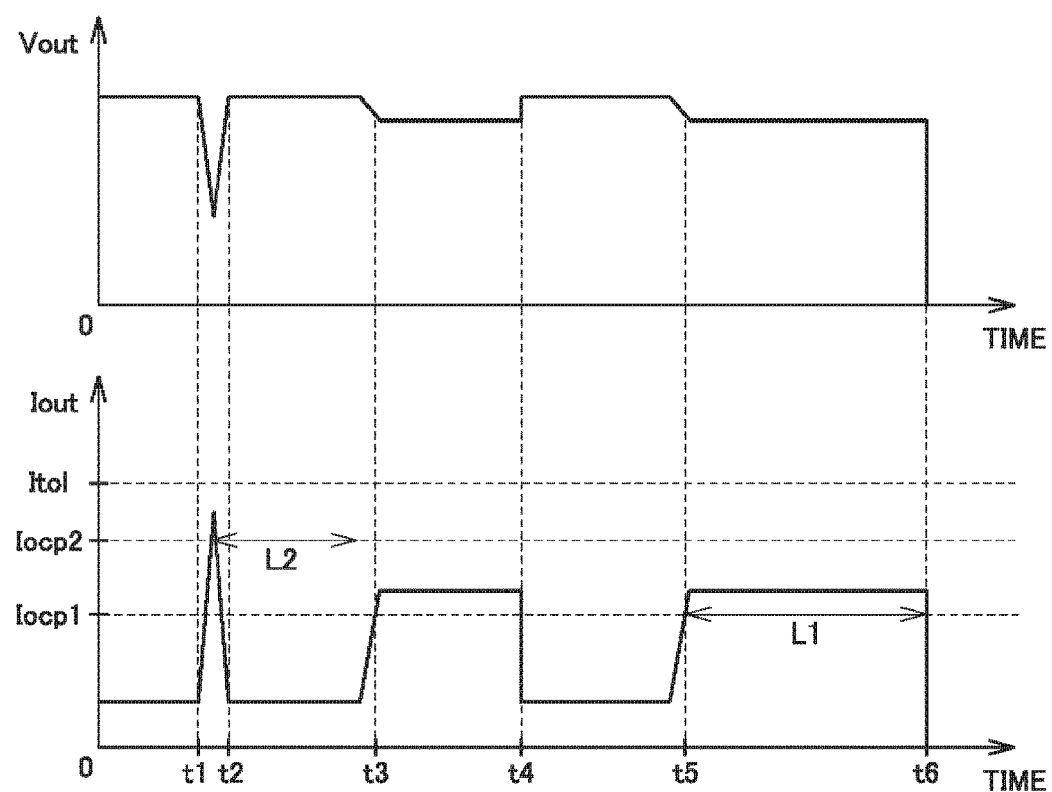

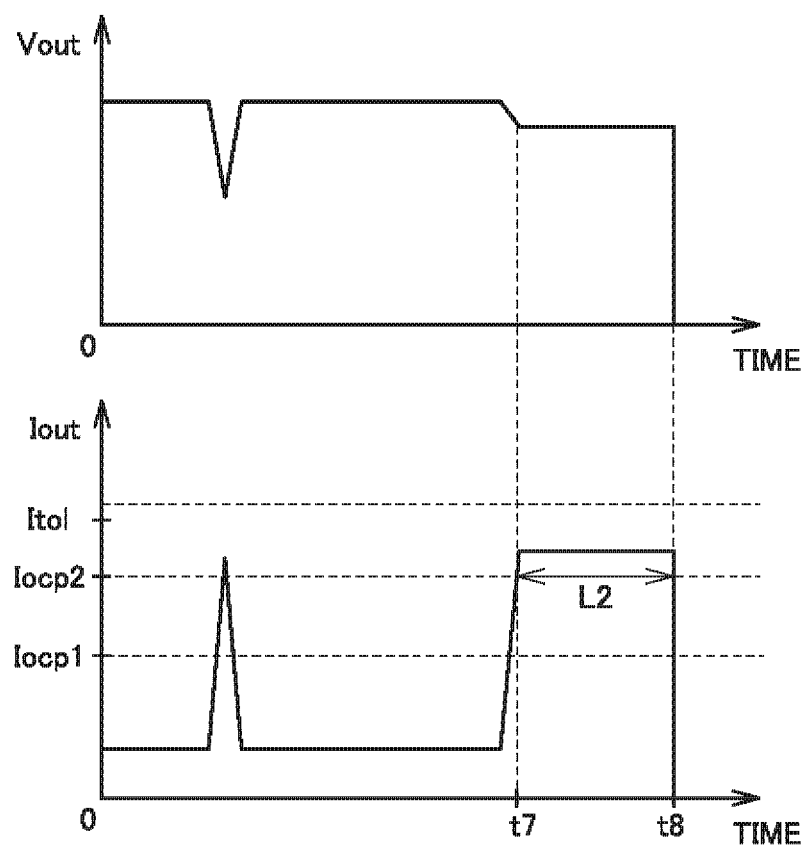

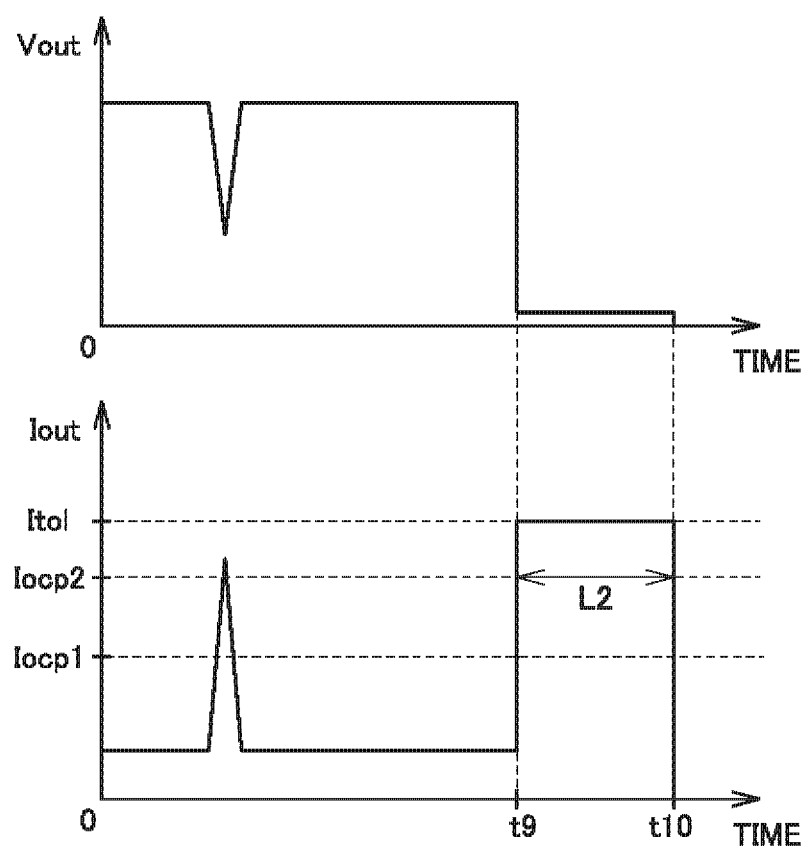

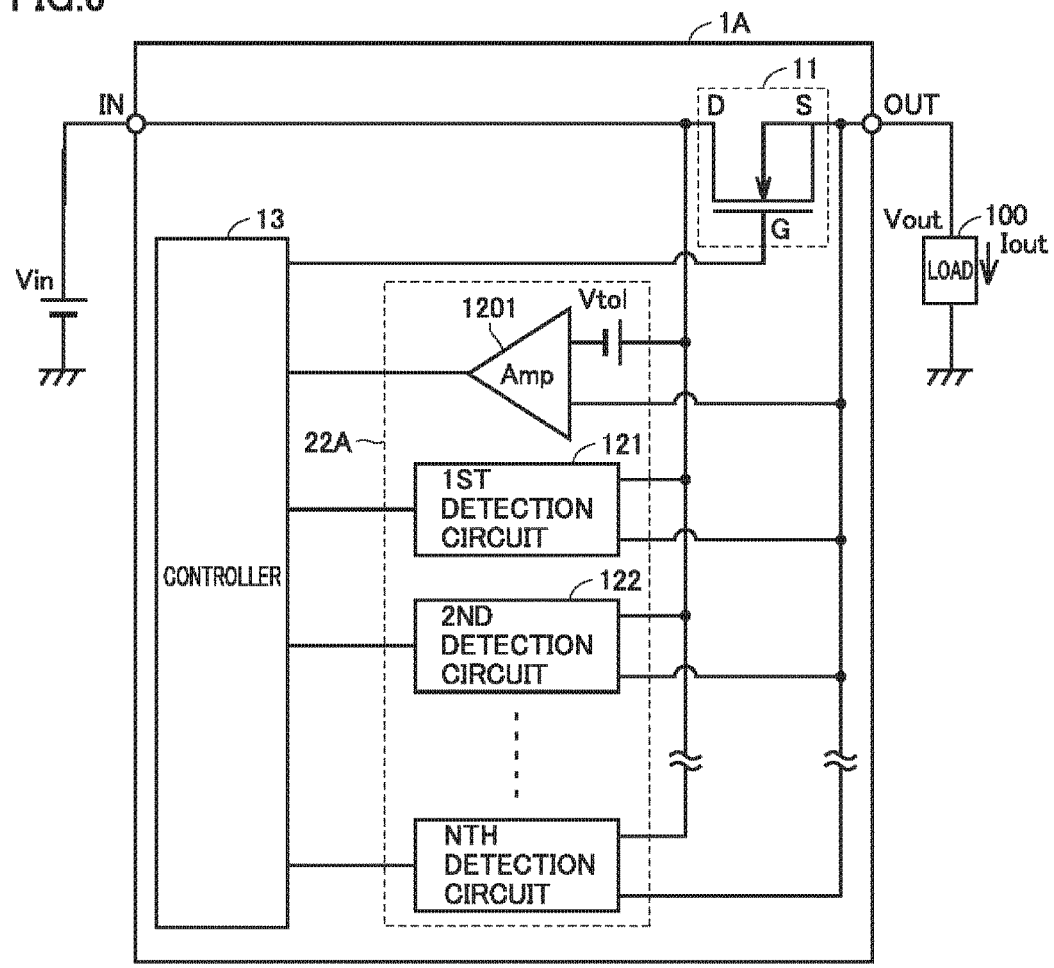

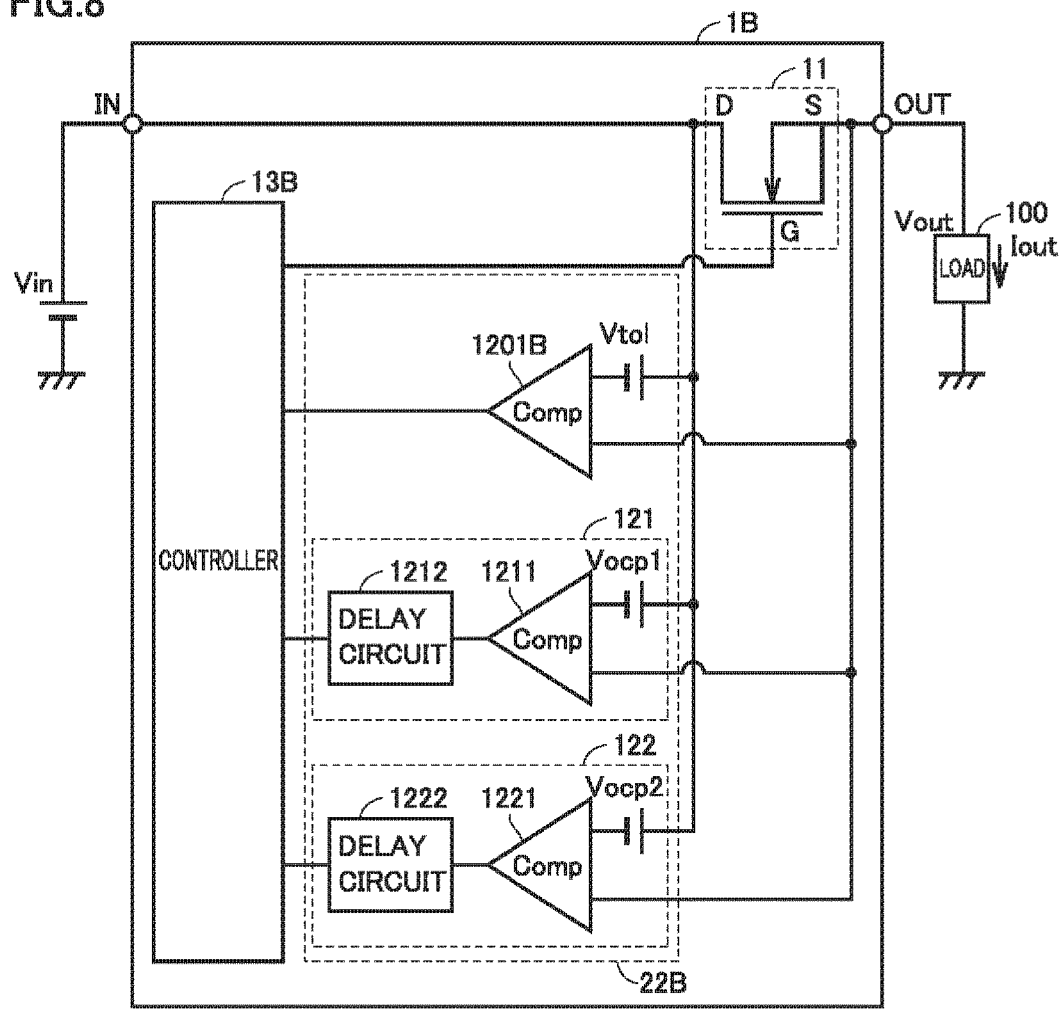

OVERCURRENT PROTECTIVE DEVICE, ELECTRONIC APPARATUS, INTEGRATED CIRCUIT, AND SIGNAL TRANSMISSION CIRCUIT

BACKGROUND OF THE INVENTION

Field of the Invention

The present invention relates to an overcurrent protective device, an electronic apparatus having the overcurrent protective device mounted therein, an integrated circuit having the overcurrent protective device integrated therewith, and a signal transmission circuit which transmits a signal from an input terminal to an output terminal via a switch or interrupts such a signal, and particularly to a technology for protecting the electronic apparatus when an internal circuit fails and short-circuits, and a signal transmission circuit and an overcurrent protective device which prevent an erroneous operation of a load by maintaining, at a low voltage, erroneous signal transmission caused by a high temperature leakage current, a noise, and the like.

Description of the Background Art

An overcurrent protective device is known which prevents an overcurrent by limiting a current supplied to a load. For example, Japanese Patent Laying-Open No. 2001-145338 discloses a switching power supply apparatus comprising a first overcurrent protective circuit that performs an overcurrent protective operation once a load current of at least a first overcurrent value which significantly exceeds a rated value flows, and a second overcurrent protective circuit that performs an overcurrent protective operation once a load current of at least a second overcurrent value which exceeds the rated value of the load current by a small magnitude and is thus less than the first overcurrent value flows for a prescribed period of time. According to this switching power supply apparatus, an appropriate overcurrent protective operation can be provided by a simple circuit configuration. Furthermore, for example, Japanese Patent Laying-Open No. 2-241325 discloses an overcurrent protective device of a power supply circuit, that performs an overcurrent protective operation for a load when an overcurrent state continues after a timer circuit's delay time elapses. According to this overcurrent protective device, a protection circuit which alleviates a heat dissipation means can be configured without taking a rush current into consideration.

An electrostatic protective circuit is proposed which uses a clamping circuit for protection of an internal circuit in an electronic apparatus feeding a power supply voltage to a load.

Japanese Patent Laying-Open No. 6-163841 discloses a circuit generating a clamp voltage by a Zener diode connected between a power supply line supplying power to an internal circuit and the ground, to suppress application of a high voltage to the internal circuit connected to the power supply line, to thus protect the internal circuit.

In the invention according to Japanese Patent Laying-Open No. 6-163841, the Zener diode has a cathode connected to the power supply line and has an anode connected to the ground via a resistor. A transistor has a collector connected to the power supply line. The transistor has an emitter connected to a ground line. The transistor has a base connected to the anode of the Zener diode.

According to the above configuration, when an overvoltage is generated, the voltage applied to the internal circuit is clamped by the breakdown voltage of the Zener diode. Furthermore, by this clamp voltage, the transistor conducts, and the current which flows through the power supply line dissipates toward the ground via the transistor.

Japanese Patent Laying-Open No. 2009-99641 discloses a circuit employing a separating resistance that is connected to an input and output terminal to cause a voltage to drop to suppress application of high voltage to an internal circuit connected to an input and output line, to thus protect the internal circuit.

The circuit by Japanese Patent Laying-Open No. 2009-99641 includes a first electrostatic protective circuit, a second electrostatic protective circuit, and a separating resistance. The first and second electrostatic protective circuits pass to the ground a surge current generated by a surge voltage applied to the input and output terminal. The separating resistance protects the internal circuit by dropping the voltage which the internal circuit receives in an early stage of application of the surge voltage.

Japanese National Patent Publication No. 2014-500700 discloses a protection circuit for a lithium battery, that has a configuration providing a clamping circuit between overcurrent protective and short circuit protective circuits and a circuit negative electrode "B−" in order to protect the overcurrent protective and short circuit protective circuits from negative high pressure generated at the circuit negative electrode "B−" when an overcharge protective function is operated and a switch M1 associated with the negative electrode of the lithium battery is brought out of conduction.

When switch M1 is brought out of conduction for overcharge protection and negative high voltage (of −20 V for example) is generated at the circuit negative electrode "B−", the clamping circuit can limit a negative voltage level of the overcurrent protective circuit and the short circuit protective circuit to a prescribed level (for example, of −2 V to −3 V) and can thus prevent damage to a low voltage MOS component included in the overcurrent protective and short circuit protective circuits.

A signal transmission circuit is proposed which transmits a signal from an input terminal to an output terminal via a switch, that prevents the signal's erroneous transmission.

Japanese Patent Laying-Open No. 2015-15643 discloses a signal transmission circuit connecting a pull-down resistor to a gate of an output transistor forming an open-drain output stage for an output terminal. According to Japanese Patent Laying-Open No. 2015-15643, when a command to drive the output transistor is ceased, the signal transmission circuit pulls the gate terminal of the transistor to the low level by the pull down resistor to prevent signal transmission.

SUMMARY OF THE INVENTION

As a configuration which performs an overcurrent protective operation by interrupting an overcurrent, there is a case in which a fuse is used. The fuse blows and interrupts an overcurrent when the overcurrent continues to flow for a period of time depending on its magnitude. The period of time after the overcurrent flows through the fuse until the fuse blows is longer when the overcurrent is smaller. By such a characteristic, a fuse can interrupt an overcurrent timely in response to the magnitude of the overcurrent. However, the fuse interrupts an overcurrent by being blown itself, and accordingly, once the fuse has interrupted an overcurrent, the fuse must be replaced with another, and is thus not maintenance-free.

Japanese Patent Laying-Open No. 2001-145338 discloses a maintenance-free overcurrent protective circuit. In a second overcurrent protective circuit of the overcurrent protective circuit, even when an overcurrent flows, an overcurrent protective operation is delayed for a determined time. Furthermore, Japanese Patent Laying-Open No. 2-241325 also discloses a maintenance-free overcurrent protective device. In the overcurrent protective circuit, even when an overcurrent flows, the overcurrent protective operation is delayed for a determined time by a timer circuit. By providing such a delay time, as well as a fuse, an overcurrent protective operation in response to an instantaneously generated rush current is not performed.

The larger an overcurrent is in magnitude, the shorter time a load endures the overcurrent for. The larger an overcurrent is in magnitude, the shorter a delay time until an overcurrent protective operation is performed should be. When the delay time until the overcurrent protective operation is performed is constant, there is a possibility that the overcurrent protective operation may not be performed timely in response to the magnitude of the overcurrent. For example, when the overcurrent has a large magnitude, the overcurrent protective operation may not be performed even though a time to perform the overcurrent protective operation has passed. Reversely, when the overcurrent has a small magnitude, an unnecessary overcurrent protective operation may be performed even though a time to perform the overcurrent protective operation has not arrived. Accordingly, neither the overcurrent protective circuit disclosed in Japanese Patent Laying-Open No. 2001-145338 nor the overcurrent protective device disclosed in Japanese Patent Laying-Open No. 2-241325 can be used as a substitute for a fuse.

An object in first and second aspects of the present invention is to provide an overcurrent protective device having a characteristic close to that of a fuse while being maintenance-free.

An electronic apparatus which supplies power supply voltage to a load may have an internal circuit destroyed by overvoltage or the like and thus short circuited. Such a failure will hereinafter be referred to as a conduction failure. That is, the conduction failure means that a current path in communication with the ground in the electronic apparatus becomes low impedance as a circuit element is destroyed or the like. When the conduction failure occurs, a large current may flow to the ground via the current path of low impedance and a problem such as a circuit generating heat may arise. There is a demand for a technique which solves such a problem.

An object of a third aspect of the present invention is to provide a circuit which suppresses passage of a current in an electronic apparatus and thus protects the electronic apparatus even when in the electronic apparatus an internal circuit short-circuits and fails.

When performing overcharge protection of a circuit, it is necessary to detect a current which flows through a power supply line, and accordingly, the overcharge protective circuit is connected to the power supply line. When high power supply voltage is applied to the power supply line, the overcharge protective circuit also needs to include an element which has a withstand voltage which can endure the power supply voltage.

Generally, an element accommodating high withstand voltage requires having an increased element size, and accordingly, a circuit which uses the high withstand voltage element has a tendency to have a larger area than a circuit which uses a low withstand voltage element. This can result in the element and the entire device becoming large in size, and the production cost also being increased. Furthermore, there is a case in which the high withstand voltage element easily has a characteristic varying more than the low withstand voltage element, and detection accuracy may be worsen by using the high withstand voltage element.

Furthermore, as there is an increasing demand for miniaturization of electronic apparatuses, also regarding such a protective circuit, there is a demand to achieve miniaturization and high level integration.

An object in a fourth aspect of the present invention is to provide an overcurrent protective device which can accommodate high voltage while suppressing an increase in scale of the device.

In the signal transmission circuit according to Japanese Patent Laying-Open No. 2015-15643, the pull down resistor connects the control terminal of the output transistor and the ground so that when the control circuit ceases to issue a command to the control terminal of the output transistor to drive it, the pull down transistor pulls to the low level the voltage applied to the control terminal of the output transistor. In order to also maintain the potential of the control terminal of the output transistor at the low level even when a high temperature leakage current, a noise, or the like is caused, it is desirable to make the pull down resistor's resistance value low. The low resistance value, however, results in the pull down resistor consuming more electric power and hence the signal transmission circuit as a whole consuming more electric power.

In contrast, when the pull down resistor has a high resistance value, it can consume less electric power, however, an effect of fixing the control terminal of the output transistor to the low level also decreases. Accordingly, when a high temperature leakage current, a noise, or the like is generated, an electric charge will be accumulated at the control terminal of the output transistor, and the output transistor is prone to conduct. This easily causes erroneous signal transmission.

An object of fifth and sixth aspects of the present invention is to provide a signal transmission circuit and an overcurrent protective device which can prevent an erroneous operation of a load by maintaining, at a low voltage, erroneous signal transmission caused as a high temperature leakage current, a noise, or the like is generated, while reducing power consumption.

An overcurrent protective device according to the first aspect of the present invention comprises an input terminal configured to receive a power supply voltage, an output terminal, a switch, a detector, and a controller. The switch is provided between the input terminal and the output terminal. The detector is configured to output a limitation signal without delay when a current flowing through the switch exceeds a prescribed tolerance value. The controller is configured to receive the limitation signal and control the switch to prevent the current from exceeding the tolerance value. The detector is configured output a turn-off signal to the controller when a first state continues for a delay time determined depending on the current's magnitude. The first state is a state where the current is smaller than the tolerance value and the current exceeds a first threshold value smaller than the tolerance value. The controller turns off the switch in response to the turn-off signal.

An overcurrent protective device according to the second aspect of the present invention comprises an input terminal configured to receive a power supply voltage, an output terminal, a switch, a detector, and a controller. The switch is provided between the input terminal and the output terminal. The detector is configured to output a turn-off signal when a specific state continues for a delay time determined depending on the current's magnitude. The specific state is a state in which a current flowing through the switch exceeds a first threshold value. The controller is configured to turn off the switch in response to the turn-off signal.

An electronic apparatus according to the third aspect of the present invention comprises a circuit including an input terminal configured to receive a power supply voltage, an output terminal configured to supply the power supply voltage to a load, an internal circuit configured to receive the power supply voltage and thus operates, and a ground terminal connected to the internal circuit. Furthermore, the electronic apparatus comprises a resistor provided between the ground terminal and the ground.

An overcurrent protective device according to the fourth aspect of the present invention, an electronic apparatus having the same mounted therein, and an integrated circuit comprise an input terminal configured to receive a power supply voltage, an output terminal, a switch, a control device, and a bias circuit. The switch is provided between the input terminal and the output terminal and configured to switch between supply and interruption of electric power from the input terminal to the output terminal. The control device is configured to turn off the switch when a current flowing through the switch exceeds a prescribed threshold value. The bias circuit is configured to supply an intermediate voltage between the power supply voltage and a ground voltage to the control device.

A signal transmission circuit according to the fifth aspect of the present invention comprises an input terminal configured to receive a power supply voltage, an output terminal, a first switch provided between the input terminal and the output terminal and having a first control terminal configured to receive a signal for switching between supply and interruption of electric power from the input terminal to the output terminal, a drive circuit configured to output a drive signal for driving the first switch to the first control terminal, a control circuit configured to output a control signal for controlling the first switch to the drive circuit, a second switch provided between the first control terminal and a ground node and having a second control terminal connected to the output terminal via a resistor, and a third switch provided between the second control terminal and a ground node and having a third control terminal to receive a control signal.

An overcurrent protective device according to the sixth aspect of the present invention comprises the signal transmission circuit according to the fifth aspect of the present invention, the control circuit including a detector configured to detect a current flowing through the first switch and a controller configured to output the control signal in response to a signal output from the detector.

According to the first and second aspects of the present invention, by delaying when an overcurrent should be interrupted for a period of time depending on the overcurrent's magnitude, an overcurrent protective device can be provided which has a characteristic close to that of a fuse while being maintenance-free. As a result, the overcurrent protective device according to the present invention can be used as a substitute for a fuse, that does not need to be replaced when it interrupts an overcurrent.

According to the third aspect of the present invention a circuit can be provided which suppresses passage of a current in an electronic apparatus and thus protects the electronic apparatus even when an internal circuit short-circuits and thus fails in the electronic apparatus.

According to the fourth aspect of the present invention, in an overcurrent protective device, by using a bias circuit, a voltage substantially applied to a control circuit can be reduced, and the control circuit can be configured with an element which has a withstand voltage lower than the power supply voltage. This can suppress an increase in circuit scale of the control circuit and prevent an increase in the production cost and a reduction in the detection accuracy.

According to the fifth or sixth aspect of the present invention, a signal transmission circuit and overcurrent protective device can be provided which can prevent an erroneous operation of a load by maintaining, at a low voltage, erroneous signal transmission caused as a high temperature leakage current, a noise, etc. are generated, while reducing power consumption.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a time chart for illustrating an operation of a first detection circuit.

FIG. 4 is a time chart for illustrating an operation of a second detection circuit.

FIG. 5 is a time chart for illustrating an operation of the detector of FIG. 1 when an abnormal situation such as a short circuit or a ground fault arises.

FIG. 6 is a functional block diagram for illustrating a function of an overcurrent protective device according to an exemplary variation of the first embodiment.

FIG. 8 is a functional block diagram for illustrating a function of an overcurrent protective device according to another exemplary variation of the first embodiment.

DESCRIPTION OF THE PREFERRED EMBODIMENTS

The present invention will now be described in embodiments hereinafter in detail with reference to the drawings. Note that in the figures, identical or corresponding components are identically denoted and will not be described repeatedly in principle.

First Embodiment

Figure 1:
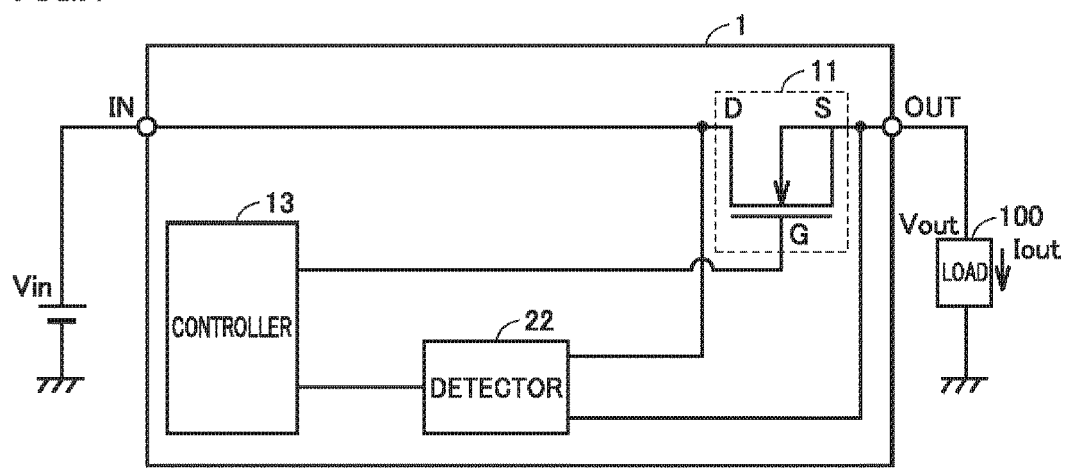
FIG. 1 is a functional block diagram for illustrating a function of an overcurrent protective device according to a first embodiment.

FIG. 1 is a functional block diagram for illustrating a function of an overcurrent protective device 1 according to a first embodiment. As shown in FIG. 1, overcurrent protective device 1 includes an input terminal IN connected to a power supply voltage Vin, an output terminal OUT connected to a load 100, a field-effect transistor (FET) 11 which is a switch provided between input terminal IN and output terminal OUT, a detector 22, and controller 13. Voltage Vout is a voltage at output terminal OUT. Current Tout is a current which flows through load 100. FET 11 is a MOSFET (Metal Oxide Semiconductor Field Effect Transistor) of Nch. The switch provided between input terminal IN and output terminal OUT may be a Pch MOSFET or a bipolar transistor, for example.

FET 11 includes a drain terminal D connected to input terminal IN, a source terminal S connected to output terminal OUT, and a gate terminal G. FET 11 has gate terminal G connected to controller 13.

Detector 22 is connected to drain terminal D of FET 11. Detector 22 is connected to source terminal S of FET 11.

Detector 22 monitors a current which flows through FET 11. When a state continues for a period of time of an extent, detector 22 outputs a turn-off signal to controller 13. In that state, the current which flows through FET 11 exceeds a prescribed threshold value and is thus an overcurrent. In response to the turn-off signal from detector 22, controller 13 controls gate terminal G of FET 11 to turn off FET 11.

Overcurrent protective device 1 introduces a delay time of an extent after the current which flows through FET 11 becomes an overcurrent until FET 11 is turned off, so that, as well as a fuse, overcurrent protective device 1 does not turn off FET 11 in response to an instantaneously generated rush current.

The larger an overcurrent is in magnitude, the shorter time load 100 can endure the overcurrent for. The larger an overcurrent is in magnitude, the shorter a delay time until FET 11 is turned off should be. When the delay time until FET 11 is turned off is always constant, there is a possibility that FET 11 may not be turned off timely in response to the magnitude of the overcurrent. For example, when the overcurrent has a large magnitude, FET 11 may not be turned off even though a time to turn off FET 11 has passed. Reversely, when the overcurrent has a small magnitude, FET 11 may be unnecessarily turned off even though a time to turn off FET 11 has not arrived.

In view of such an issue, the first embodiment provides a configuration providing a delay time varying depending on the magnitude of the overcurrent. Specifically, detector 22 outputs a turn-off signal to controller 13 when a state continues for a first delay time L1. In that state, a current which flows through FET 11 exceeds a first threshold value Iocp1. Detector 22 outputs the turn-off signal to controller 13 when a state continues for a second delay time L2 smaller than L1. In that state, a current which flows through FET 11 exceeds a second threshold value Iocp2 larger than Iocp1. By providing a delay time stepwise depending on the magnitude of the overcurrent, overcurrent protective device 1 can implement a characteristic close to that of a fuse.

Note that for overcurrent protective device 1 a tolerable current Itol (>Iocp2) is set. When a current exceeding tolerable current Itol flows, a possibility increases that overcurrent protective device 1 itself will be destroyed. Tolerable current Itol is similarly set for second to fourth embodiments described hereinafter.

Figure 2:
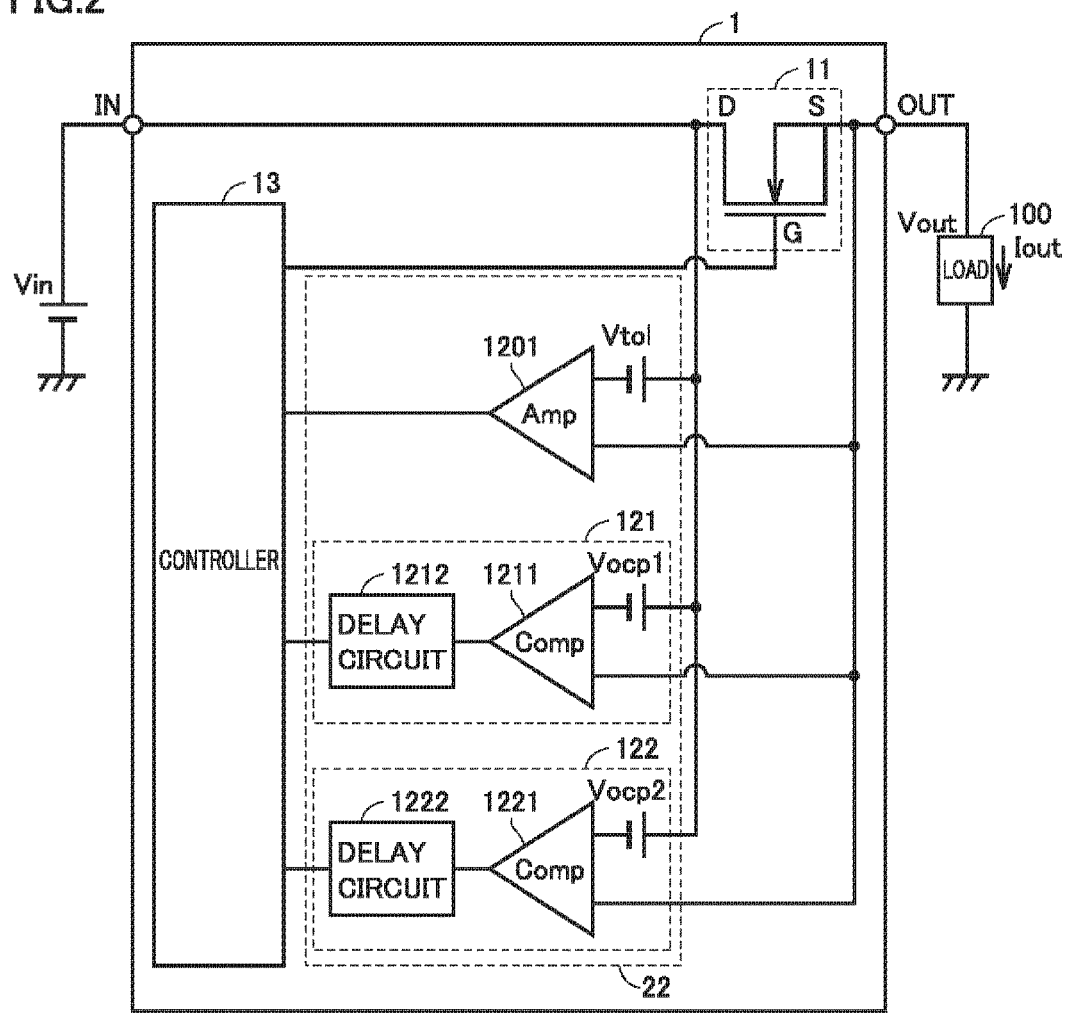
FIG. 2 is a functional block diagram for illustrating a configuration of a detector of FIG. 1.

FIG. 2 is a functional block diagram for illustrating a configuration of detector 22 of FIG. 1. As shown in FIG. 2, detector 22 includes an operational amplifier 1201, a first detection circuit 121, and a second detection circuit 122.

Operational amplifier 1201 has a first terminal connected to drain terminal D of FET 11. For the first terminal of operational amplifier 1201, a tolerable voltage Vtol is set as an offset voltage. Operational amplifier 1201 has a second terminal connected to source terminal S of FET 11.

When a current which flows through overcurrent protective device 1 reaches tolerable current Itol, operational amplifier 1201 accordingly outputs a signal to controller 13 without delay (hereinafter also referred to as a "limitation signal"). In response to the limitation signal, controller 13 limits the current that flows through FET 11 to tolerable current Itol.

Operational amplifier 1201 is provided to prevent overcurrent protective device 1 from being destroyed for example as a current larger than tolerable current Itol flows because of a ground fault or a short circuit. More specifically, operational amplifier 1201 determines whether the voltage between drain terminal D and source terminal S of FET 11 exceed tolerable voltage Vtol. When the voltage between drain terminal D and source terminal S of FET 11 exceeds tolerable voltage Vtol, operational amplifier 1201 outputs the limitation signal to controller 13 without delay.

When FET 11 has an on resistance Ron, the following expression (1) holds:

$$Vtol = Ron \cdot Itol \quad (1).$$

More specifically, determining whether the voltage between drain terminal D and source terminal S of FET 11 exceeds tolerable voltage Vtol means determining whether the current which flows through FET 11 exceeds tolerable current Itol.

In response to the limitation signal, controller 13 controls the voltage between gate terminal G and source terminal S of FET 11 to prevent the current flowing through FET 11 from exceeding tolerable current Itol.

First detection circuit 121 includes a comparator 1211 and a delay circuit 1212. Comparator 1211 has a first terminal connected to drain terminal D of FET 11. For the first terminal of comparator 1211, a voltage Vocp1 is set as an offset voltage. Comparator 1211 has a second terminal connected to source terminal S of FET 11.

Comparator 1211 determines whether the voltage between drain terminal D and source terminal S of FET 11 exceeds voltage Vocp1. When the voltage between drain terminal D and source terminal S of FET 11 exceeds Vocp1, comparator 1211 accordingly outputs a signal to delay circuit 1212 (hereinafter also referred to as an "excess signal").

When FET 11 has on resistance Ron, the following expression (2) holds:

$$Vocp1 = Ron \cdot Iocp1 \quad (2).$$

More specifically, determining whether the voltage between drain terminal D and source terminal S of FET 11 exceeds voltage Vocp 1 means determining whether the current which flows through FET 11 exceeds a first threshold value Iocp1.

Delay circuit 1212 outputs a turn-off signal to controller 13 when delay circuit 1212 continues to receive the excess signal from comparator 1211 for first delay time L1. Although not shown, delay circuit 1212 includes a counter circuit or what sets as a delay time a period of time elapsing until a voltage across a capacitor attains a prescribed voltage, for example.

Second detection circuit 122 includes a comparator 1221 and a delay circuit 1222. Comparator 1221 has a first terminal connected to drain terminal D of FET 11. For the first terminal of comparator 1221, a voltage Vocp2 is set as an offset voltage. Comparator 1221 has a second terminal connected to source terminal S of FET 11.

Comparator 1211 determines whether the voltage between drain terminal D and source terminal S of FET 11 exceeds voltage Vocp2. When the voltage between drain terminal D and source terminal S of FET 11 exceeds Vocp2, comparator 1221 outputs a signal to delay circuit 1222 accordingly.

When FET 11 has on resistance Ron, the following expression (3) holds:

$$Vocp2 = Ron \cdot Iocp2 \quad (3).$$

More specifically, determining whether the voltage between drain terminal D and source terminal S of FET 11 exceeds voltage Vocp2 means determining whether the current which flows through FET 11 exceeds second threshold value Iocp2.

When delay circuit 1222 continues to receive from comparator 1221 for second delay time L2 a signal indicating that the voltage between drain terminal D and source terminal S of FET 11 exceeds Vocp2, delay circuit 1222 outputs the turn-off signal to controller 13.

FIG. 3 is a time chart for illustrating an operation of first detection circuit 121. As shown in FIG. 3, between time t1 and time t2, a rush current is caused as load 100 operates. This rush current exceeds both first threshold value Iocp1 and second threshold value Iocp2. However, a period of time for which this rush current exceeds these threshold values is shorter than both first delay time L1 and second delay time L2. Accordingly, neither first detection circuit 121 nor second detection circuit 122 output the turn-off signal.

Current Tout exceeds first threshold value Iocp1 for a period of time from time t3 to time t4 and a period of time from time t5 to time t6. However, the period of time from time t3 to time t4 is shorter than first delay time L1. First detection circuit 121 does not output the turn-off signal to controller 13 immediately after time t3. In contrast, the period of time from time t5 to time t6 reaches first delay time L1. First detection circuit 121 outputs the turn-off signal to controller 13 immediately after time t6. Controller 13 turns off FET 11 in response to the turn-off signal.

FIG. 4 is a time chart for illustrating an operation of second detection circuit 122. As shown in FIG. 4, between time t7 and time t8, current Tout exceeds second threshold value Iocp2. The period of time from time t7 to time t8 reaches second delay time L2. Second detection circuit 122 outputs the turn-off signal to controller 13 immediately after time t8. Controller 13 turns off FET 11 in response to the turn-off signal.

FIG. 5 is a time chart for illustrating an operation of detector 22 when an abnormal situation such as a short circuit or a ground fault arises. As shown in FIG. 5, at time t9, for example a ground fault or a short circuit arises, and accordingly, current Tout rapidly increases, and reaches tolerable current Itol. Operational amplifier 1201 outputs the limitation signal to controller 13 immediately after time t9. In response to the limitation signal, controller 13 controls FET 11 to limit the current that flows through FET 11 to tolerable current Itol.

For a period of time from time t9 to time t10, current Tout exceeds second threshold value Iocp2. The period of time from time t9 to time t10 reaches second delay time L2. Second detection circuit 122 outputs the turn-off signal to controller 13 immediately after time t10. Controller 13 turns off FET 11 in response to the turn-off signal.

Overcurrent protective device 1 can thus turn off FET 11 timely by a delay time provided stepwise depending on the magnitude of current Tout. In other words, overcurrent protective device 1 can implement a characteristic close to that of a fuse while being maintenance-free. As a result, overcurrent protective device 1 can be used as a substitute for a fuse, that does not need to be replaced when it turns off FET 11.

First Embodiment in Exemplary Variation

In the first embodiment, a case where detector 22 includes two detection circuits is illustrated. The number of the detection circuits which detector 22 includes is not limited to two. An exemplary variation of the first embodiment illustrates a case where detector 22 includes three or more detection circuits.

The exemplary variation of the first embodiment is different from the first embodiment in that the detector includes N detection circuits, where N>2. The remainder in configuration is similar to that of the first embodiment, and accordingly, it will not be described repeatedly.

FIG. 6 is a functional block diagram for illustrating a function of an overcurrent protective device 1A according to the exemplary variation of the first embodiment. As shown in FIG. 6, detector 22A includes a first detection circuit, a second detection circuit, . . . and an Nth detection circuit. Each detecting circuit includes a comparator and a delay circuit in a configuration similar to that of the first and second detection circuits described in the first embodiment. Each detection circuit has a first threshold value Iocp1, a second threshold value Iocp2, . . . and an Nth threshold value IocpN. These threshold values and tolerable current Itol have a relationship in magnitude, as represented by the following expression (4):

$$Iocp1 < Iocp2 < \ldots < IocpN < Itol \quad (4).$$

Each detection circuit has a first delay time L1, a second delay time L2, . . . and an Nth delay time LN. These delay times have a relationship in magnitude, as represented by the following expression (5):

$$L1 > L2 > \ldots > LN \quad (5).$$

More specifically, when the current's threshold value has a larger value, a delay time corresponding thereto is shorter.

Figure 7A:
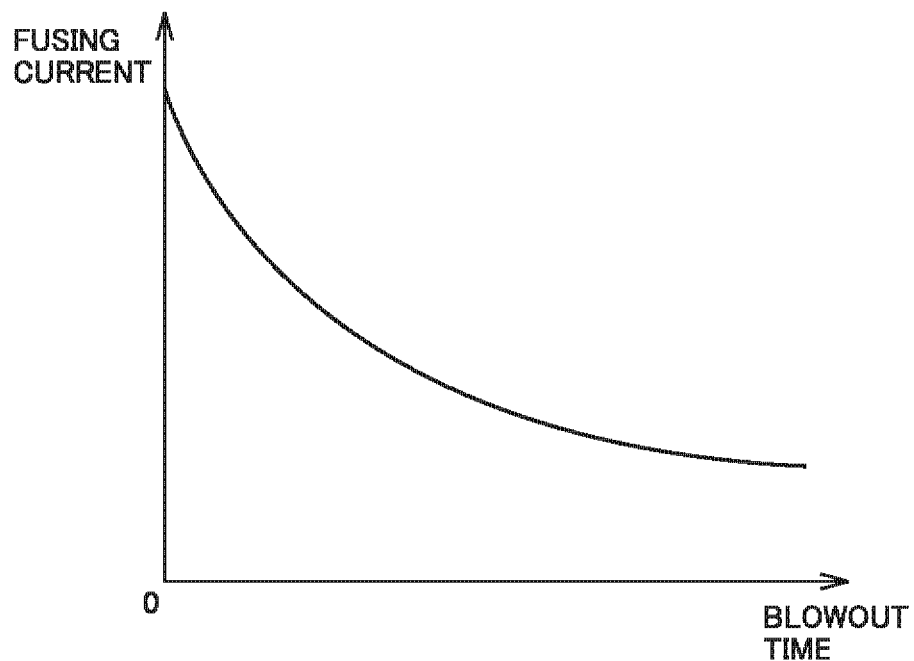
FIG. 7A represents a characteristic of a fuse and FIG. 7B represents a characteristic of the overcurrent protective device.
Figure 7B:
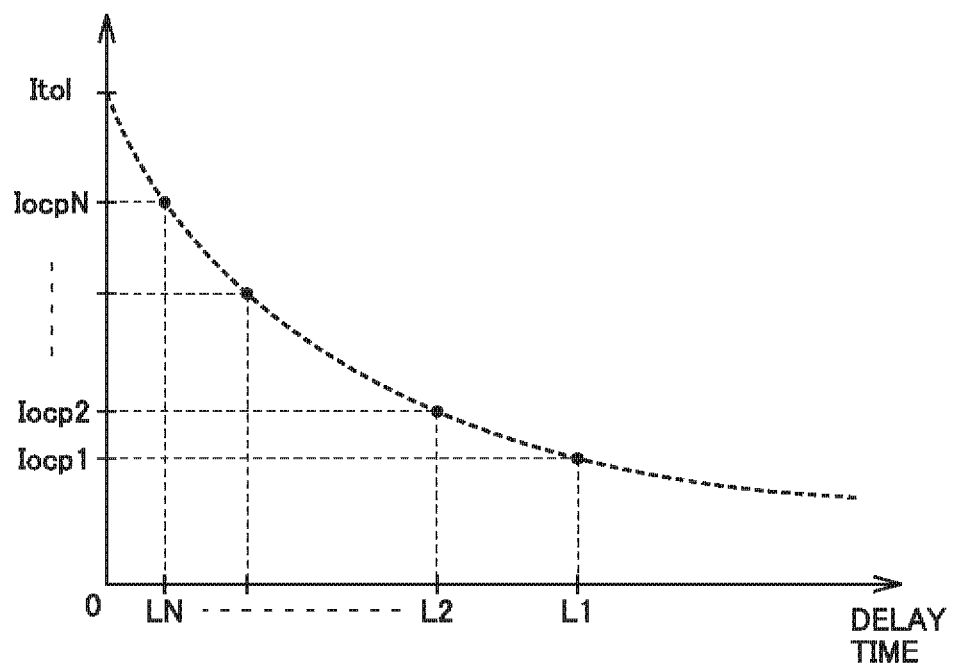

FIG. 7A represents a characteristic of a fuse. As shown in FIG. 7A, the larger the current flowing through the fuse is, the longer the period of time elapsing until the fuse blows is. FIG. 7B represents a characteristic of overcurrent protective device 1. As shown in FIG. 7B, in overcurrent protective device 1A also, the larger the threshold value of the current is, the shorter the delay time is set to be.

Thus, overcurrent protective device 1A can turn off FET 11 timely by a delay time provided stepwise depending on the magnitude of current Tout. In other words, overcurrent protective device 1A can implement a characteristic close to that of a fuse while being maintenance-free. As a result, overcurrent protective device 1A can be used as a substitute for a fuse, that does not need to be replaced when it turns off FET 11.

Overcurrent protective device 1A provided with the current's threshold value in three steps or more can have a characteristic closer to that of a fuse than overcurrent protective device 1 with the current's threshold value in two steps.

In the first embodiment, a case is described in which in response to the limitation signal, controller 13 limits the current that flows through FET 11 to tolerable current Itol. Controller 13 may turn off FET 11 in response to the limitation signal. FIG. 8 is a functional block diagram for illustrating a function of an overcurrent protective device 1B according to another exemplary variation of the first embodiment. As shown in FIG. 8, overcurrent protective device 1B comprises a detector 22B including a comparator 1201B rather than operational amplifier 1201. When a current which flows through overcurrent protective device 1B reaches tolerable current Itol, comparator 1201B outputs the limitation signal to a controller 13B without delay. Controller 13B turns off FET 11 in response to the limitation signal. This configuration can also prevent overcurrent protective device 1B from being destroyed as a current larger than tolerable current Itol flows.

Figure 9:
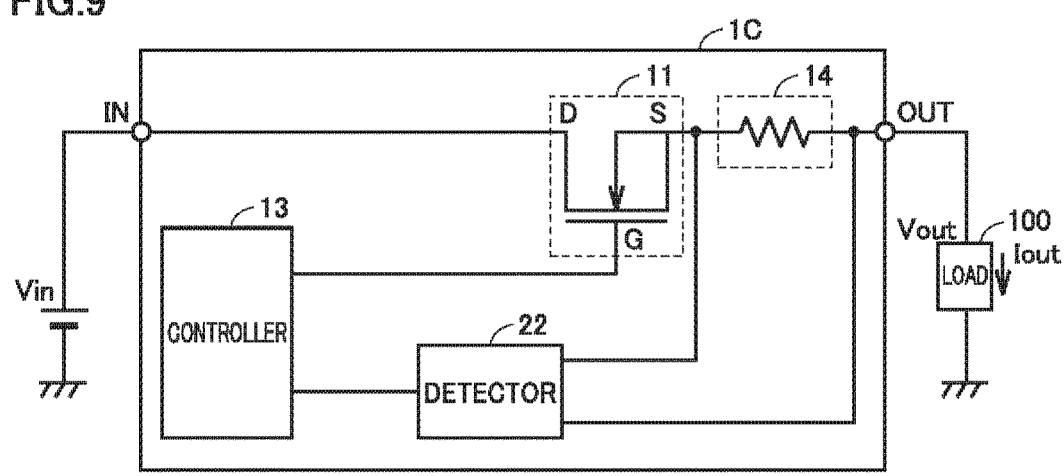
FIG. 9 is a functional block diagram for illustrating a function of an overcurrent protective device according to another exemplary variation of the first embodiment.

In the first embodiment a case is described in which detector 22 detects current Tout output to load 100 from a difference in voltage between drain terminal D of FET 11 and source terminal S of FET 11. Detector 22 may detect current Tout in a method other than the above method. For example, as done by an overcurrent protective device 1C shown in FIG. 9, current Tout may be detected from a difference in voltage between the opposite ends of a resistor 14 provided between a source terminal of FET 11 and output terminal OUT.

Second Embodiment

In the first embodiment a configuration is described in which once controller 13 has turned off FET 11, thereafter controller 13 does not return FET 11 to an electrical conduction state automatically. In the second embodiment a case will be described in which after controller 13 turns off FET 11 once a prescribed period of time elapses controller 13 returns FET 11 to the electrical conduction state.

The second embodiment is different from the first embodiment in that after controller 13 turns off FET 11 once a prescribed period of time elapses controller 13 returns FET 11 to the electrical conduction state. The remainder in configuration is similar to that of the first embodiment, and accordingly, it will not be described repeatedly.

Figure 10:
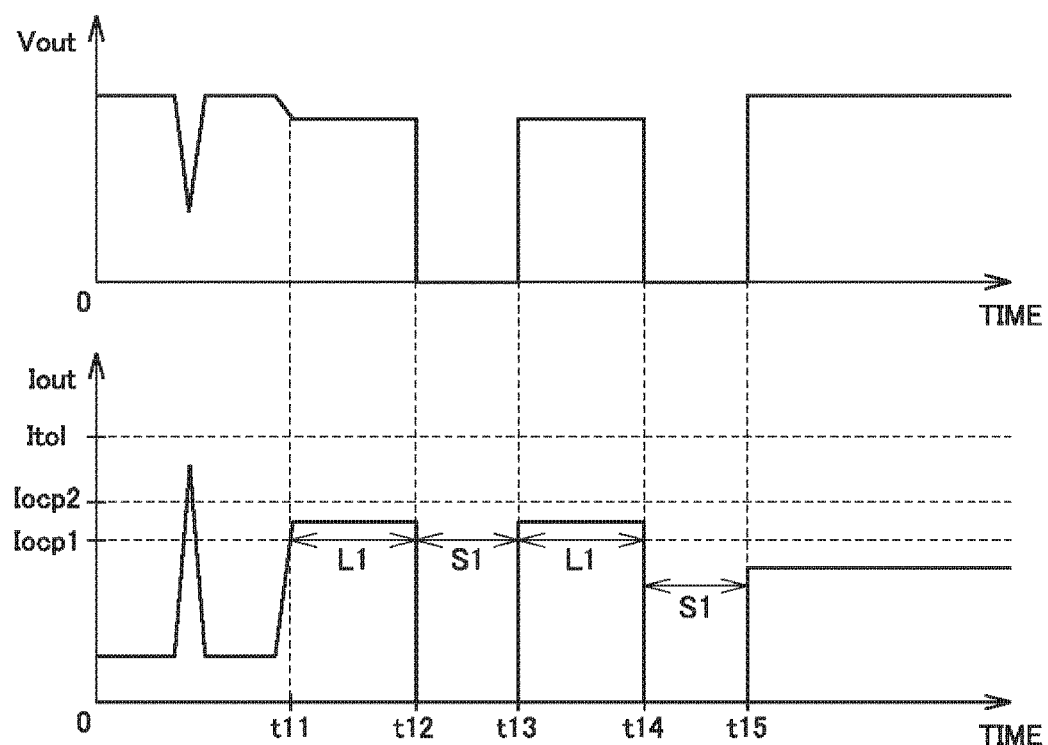
FIG. 10 is a time chart of a current in a second embodiment.

FIG. 10 is a time chart of current Tout in the second embodiment. As shown in FIG. 10, current Tout between time t11 and time t12 exceeds first threshold value Iocp1. The period of time from time t11 to time t12 reaches first delay time L1. First detection circuit 121 outputs the turn-off signal to controller 13 immediately after time t12. Controller 13 turns off FET 11 in response to the turn-off signal.

Controller 13 turns off FET 11 immediately after time t12, and thereafter when a prescribed period of time Si elapses, that is, at time t13, controller 13 returns FET 11 to the electrical conduction state. Current Tout also exceeds first threshold value Iocp1 at time t13, and that state continues until first delay time L1 elapses, that is, time t14. First detection circuit 121 outputs the turn-off signal to controller 13 immediately after time t14. Controller 13 turns off FET 11 in response to the turn-off signal.

Controller 13 turns off FET 11 immediately after time t14, and thereafter when prescribed period of time Si elapses, that is, at time t15, controller 13 returns FET 11 to the electrical conduction state. Current Tout at time t15 is below first threshold value Iocp1. First detection circuit 121 does not output the turn-off signal to controller 13.

Thus the overcurrent protective device according to the second embodiment has an effect similar to that of the first embodiment, and also allows FET 11 that has once been turned off to return to the electrical conduction state automatically once a prescribed period of time elapses so that when current Tout has returned to a normal state, continuous electric power supply to a load can be resumed.

Third Embodiment

In the first embodiment a configuration is described in which detector 22 includes a plurality of detection circuits with different delay times to implement a delay time corresponding to a magnitude of current Tout. The method of implementing a delay time depending on a magnitude of current Tout is not limited to the method using the plurality of detection circuits with different delay times. In a third embodiment a case will be described in which a delay time is dynamically varied depending on current Tout.

Figure 11:
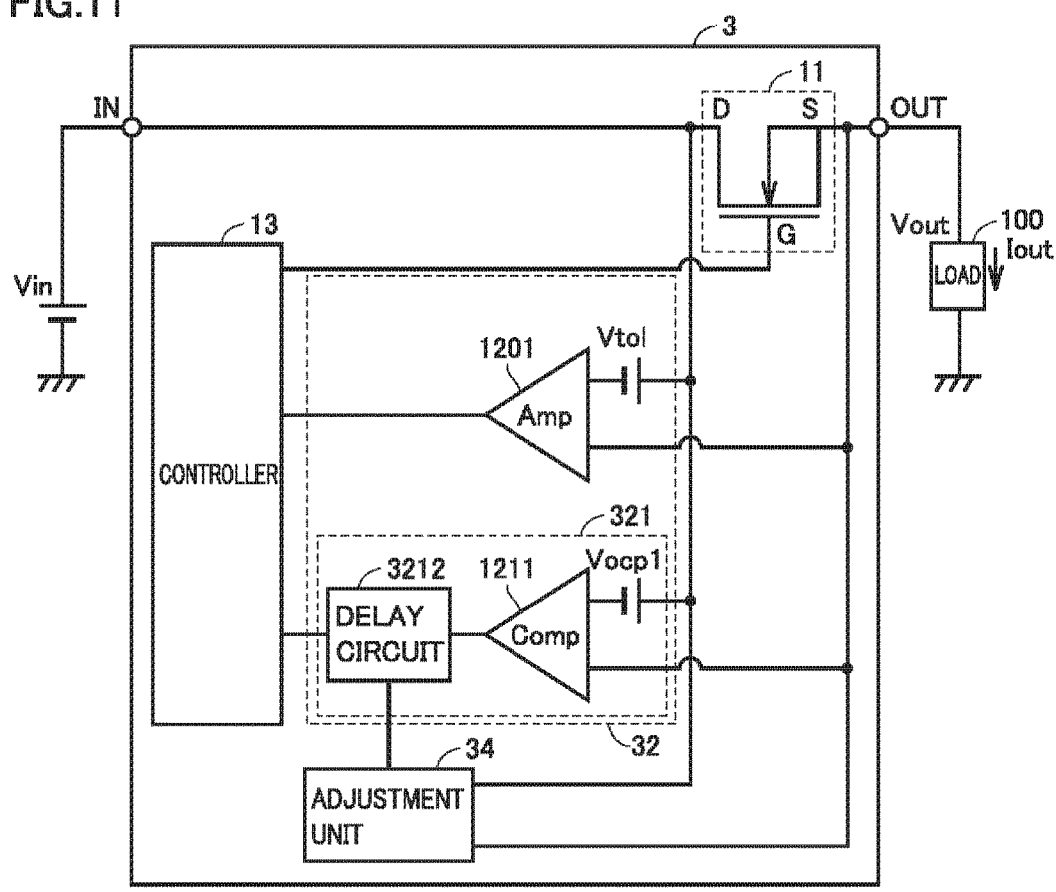
FIG. 11 is a functional block diagram for illustrating a function of an overcurrent protective device according to a third embodiment.

The third embodiment is different from the first embodiment in that an overcurrent protective device according to the third embodiment includes an adjustment unit which varies a delay time dynamically depending on current Tout. The remainder is similar to that of the first embodiment, and accordingly, it will not be described repeatedly. Note that while FIG. 11 shows only the first detection circuit for the sake of illustration, the detector may include a plurality of detection circuits. This also applies to a fourth embodiment described hereinafter.

FIG. 11 is a functional block diagram for illustrating a function of an overcurrent protective device 3 according to the third embodiment. As shown in FIG. 11, overcurrent protective device 3 includes a detector 32 and an adjustment unit 34.

Detector 32 includes a first detection circuit 321. First detection circuit 321 includes a delay circuit 3212.

Adjustment unit 34 is connected to delay circuit 3212. Adjustment unit 34 is connected to drain terminal D of FET 11. Adjustment unit 34 is connected to source terminal S of FET 11.

Figure 12:
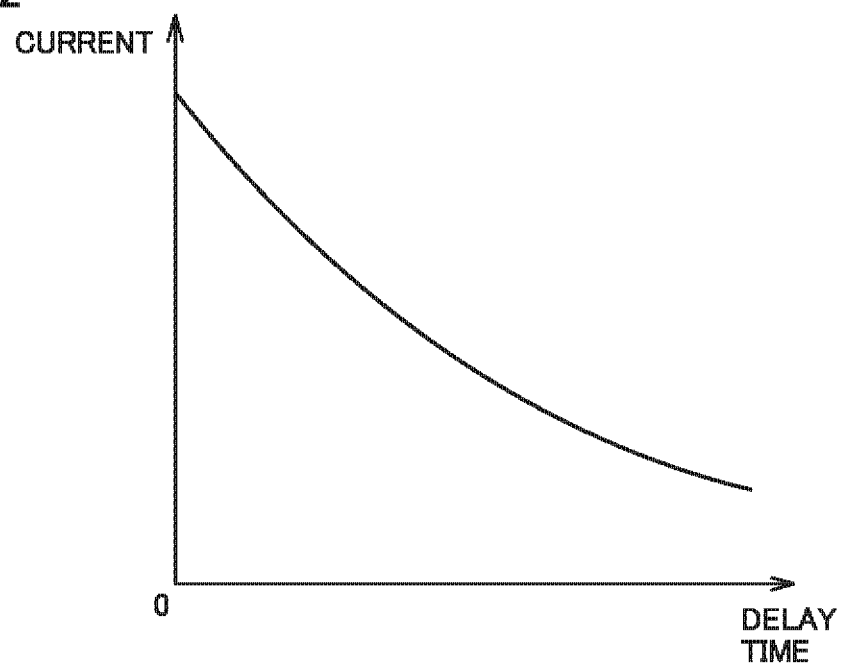
FIG. 12 shows a relationship between a current and a delay time set by an adjustment unit.

Adjustment unit 34 adjusts a delay time of delay circuit 3212 depending on current Tout which flows through FET 11. FIG. 12 shows a relationship between current Tout and a delay time set by adjustment unit 34. As shown in FIG. 12, as the current flowing through FET 11 increases, adjustment unit 34 sets a shorter delay time.

Thus, overcurrent protective device 3 can turn off FET 11 timely by setting a delay time variably depending on the magnitude of current Tout. In other words, overcurrent protective device 3 can implement a characteristic close to that of a fuse. As a result, overcurrent protective device 3 can be used as a substitute for the fuse.

Overcurrent protective device 3 can thus vary a delay time dynamically depending on current Tout, so that when it is compared with the overcurrent protective device according to the first embodiment having a delay time set stepwise overcurrent protective device 3 allows the delay time to vary smoothly and thus has a characteristic close to that of a fuse.

Figure 13:
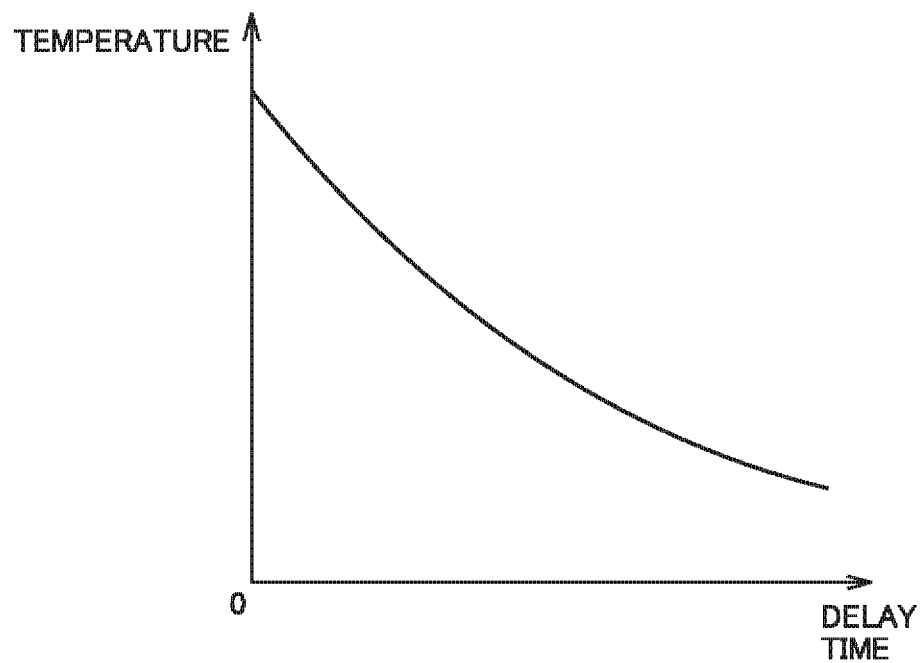
FIG. 13 shows a relationship between a field effect transistor's temperature and a delay time set by the adjustment unit.

Adjustment unit 34 sets a delay time dynamically depending on the magnitude of current Tout. What serves as a reference in setting the delay time is not limited to current Tout. Any physical quantity that has a correlation with current Tout is applicable. For example, as current Tout increases, the temperature of FET 11 increases. Adjustment unit 34 may set a delay time based on the temperature of FET 11. FIG. 13 shows a relationship between the temperature of FET 11 and a delay time set by the adjustment unit. As shown in FIG. 13, as the temperature of FET 11 increases, adjustment unit 34 sets a shorter delay time.

Fourth Embodiment

In the third embodiment the delay time is varied by the adjustment unit. However, the user of the overcurrent protective device cannot set the delay time. In the fourth embodiment a case will be described in which a delay circuit includes a component that is a resistor or a capacitor that can be varied by a user outside the overcurrent protective device and the delay circuit thus provides a variable delay time.

The fourth embodiment is different from the first embodiment in that a delay circuit is composed of a resistor or a capacitor that can be varied outside the overcurrent protective device. The remainder in configuration is similar to that of the first embodiment, and accordingly, it will not be described repeatedly.

When a detector includes a delay circuit including a capacitor, and a period of time elapsing until the voltage across the capacitor attains a prescribed voltage is set as a delay time, then, a current I1 which flows through the delay circuit, a capacitance C of the capacitor included in the delay circuit, and a period of time elapsing until the voltage across the capacitor attains a prescribed voltage Vth, that is, the delay circuit's delay time L, are known to have a relationship approximately represented by an expression (6):

$$L = C \cdot Vth/I1 \qquad (6).$$

In other words, delay time L can be varied by varying current I1 or capacitance C. In the fourth embodiment, this fact is utilized to make the delay circuit's delay time variable.

Figure 14:
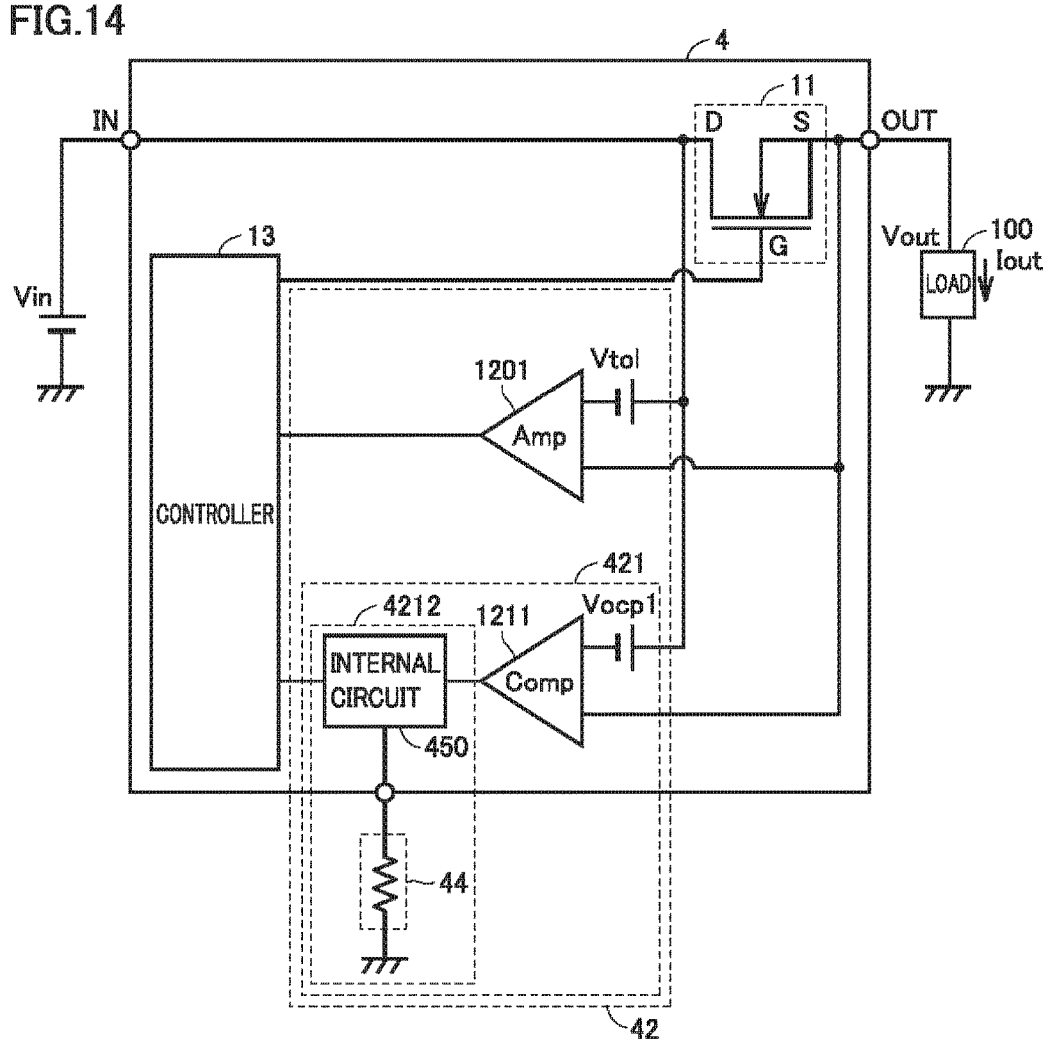
FIG. 14 is a functional block diagram for illustrating a function of an overcurrent protective device according to a fourth embodiment.

FIG. 14 is a functional block diagram for illustrating a function of an overcurrent protective device 4 according to the fourth embodiment. As shown in FIG. 14, overcurrent protective device 4 includes a detector 42. Detector 42 includes a first detection circuit 421. First detection circuit 421 has a delay circuit 4212. Delay circuit 4212 has an internal circuit 450 and a resistor 44. Resistor 44 is attached from outside of overcurrent protective device 4. Resistor 44 is exchangeable with another resistor.

Figure 15:
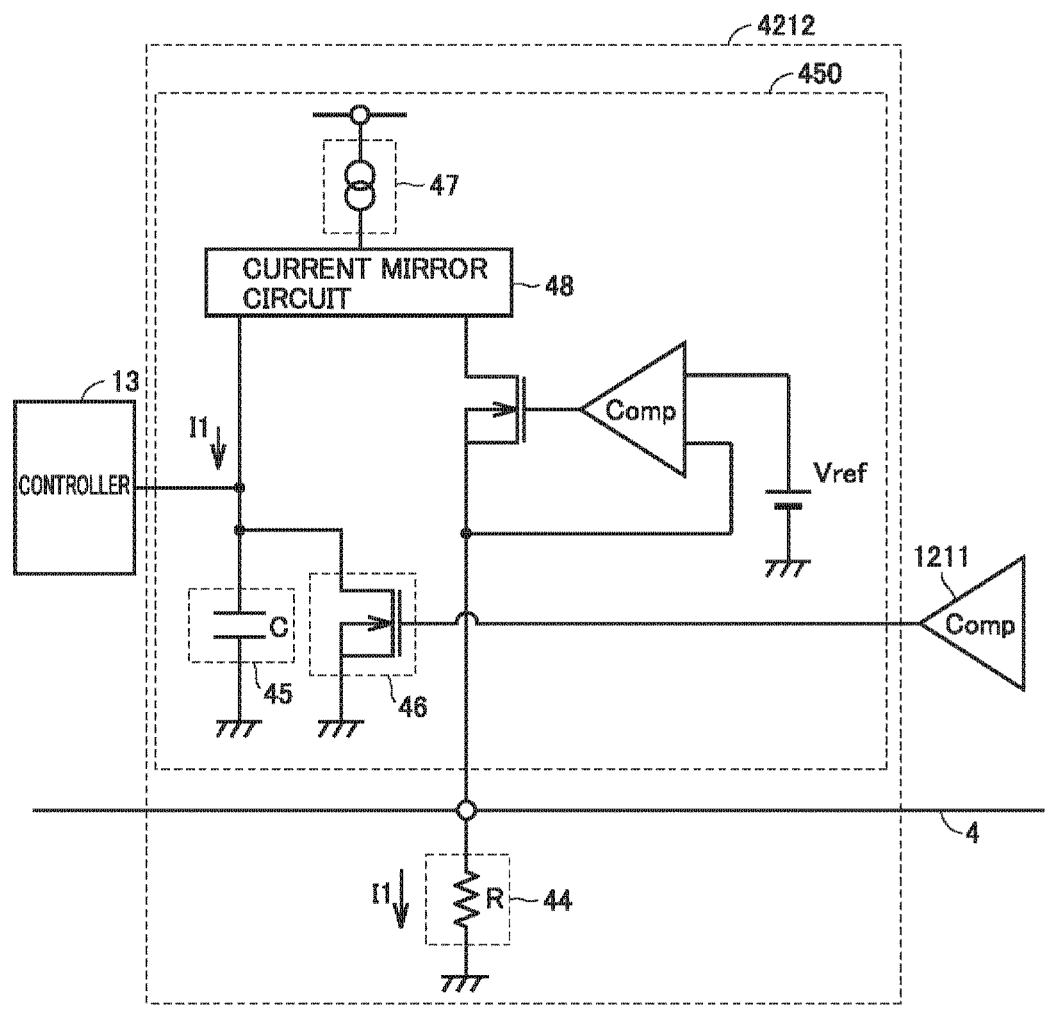
FIG. 15 is a circuit diagram for showing a configuration of an internal circuit of FIG. 14.

FIG. 15 is a circuit diagram for showing a configuration of internal circuit 450 of FIG. 14. As shown in FIG. 15, internal circuit 450 has a capacitor 45, a FET 46, a constant current source 47, and a current mirror circuit 48. Resistor 44 and capacitor 45 are connected to current mirror circuit 48. Constant current source 47 supplies current mirror circuit 48 with a constant current.

When internal circuit 450 receives the excess signal from comparator 1211, FET 46 is turned off. As a result, current I1 flowing through FET 46 till then starts to be supplied to capacitor 45. Once the voltage across capacitor 45 has attained prescribed voltage Vth, the turn-off signal is output to controller 13.

Current I1 supplied to capacitor 45 is the same as a current which flows through resistor 44 by an effect of the current mirror circuit. Since the current which flows through resistor 44 varies with a resistance value R, current I1 can be varied by resistance R.

Thus, a period of time elapsing until the voltage across capacitor 45 reaches prescribed voltage Vth, that is, delay time L of delay circuit 4212, can be increased according to expression (6) by increasing the resistance value of resistor 44.

Figure 16:
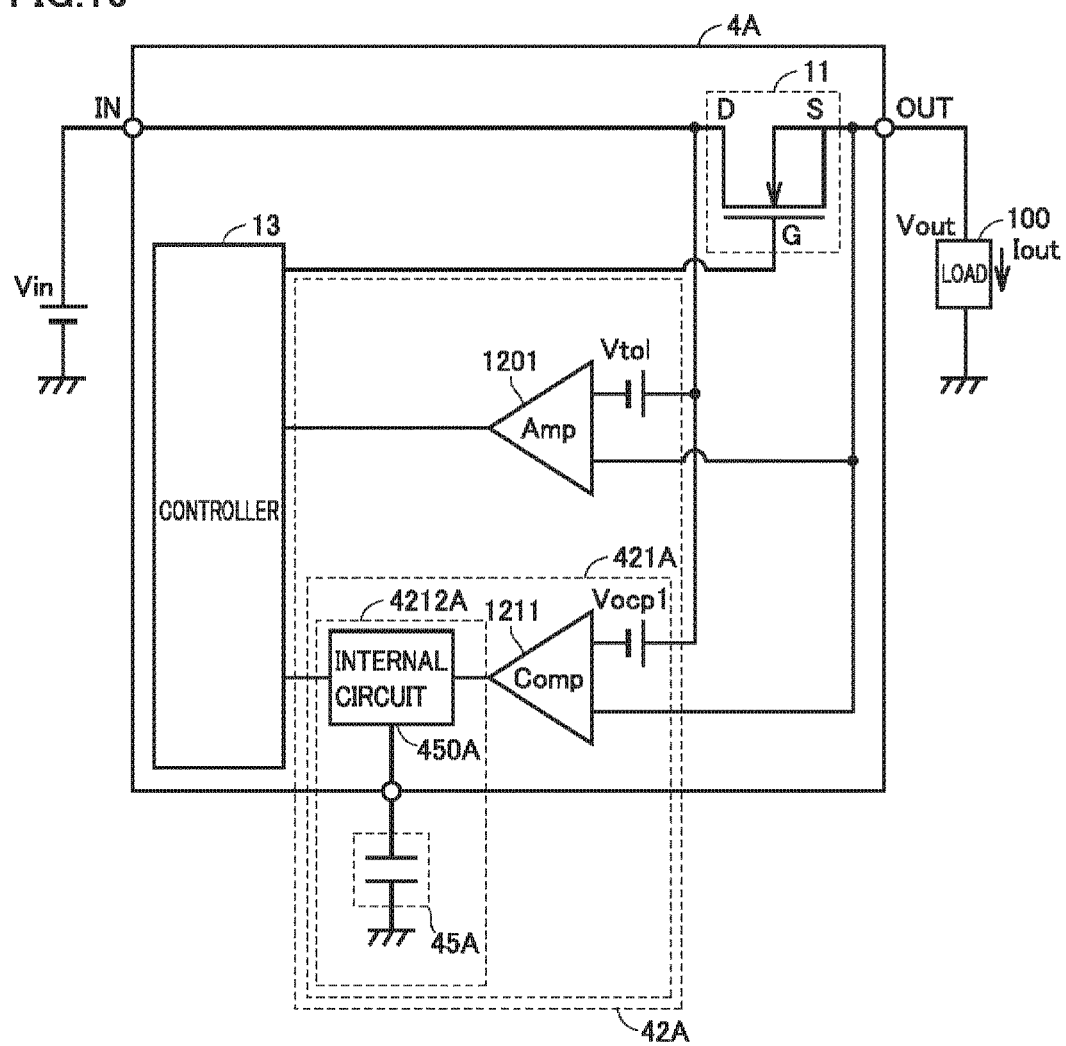
FIG. 16 is a functional block diagram for illustrating a function of another overcurrent protective device according to the fourth embodiment.

FIG. 16 is a functional block diagram for illustrating a function of another overcurrent protective device 4A according to the fourth embodiment. As shown in FIG. 16, overcurrent protective device 4A includes a detector 42A. Detector 42A includes a first detection circuit 421A. First detection circuit 421A has a delay circuit 4212A. Delay circuit 4212A has an internal circuit 450A and a capacitor 45A. Capacitor 45A is attached from outside of overcurrent protective device 4A. Capacitor 45A is exchangeable with another capacitor.

Figure 17:
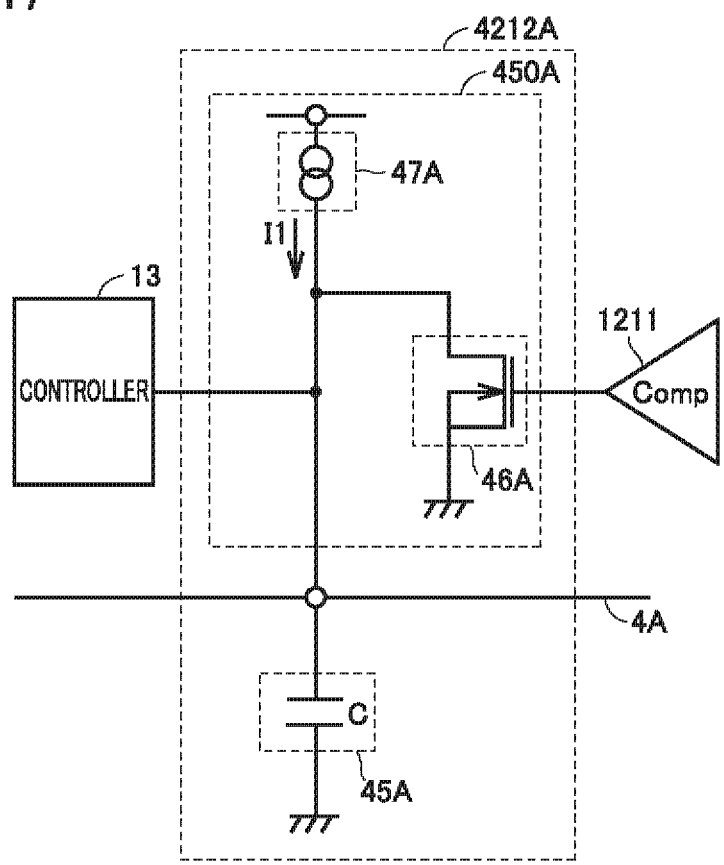
FIG. 17 is a circuit diagram for showing a configuration of an internal circuit of FIG. 16.

FIG. 17 is a circuit diagram for showing a configuration of internal circuit 450A of FIG. 16. As shown in FIG. 17, internal circuit 450A has a capacitor 45A, a FET 46A, and a constant current source 47A. Current I1 is a current supplied from constant current source 47A.

When internal circuit 450A receives the excess signal from comparator 1211, FET 46A is turned off. As a result, current I1 flowing through FET 46A till then starts to be supplied to capacitor 45A. Once the voltage across capacitor 45A has attained prescribed voltage Vth, the turn-off signal is output to controller 13.

A period of time elapsing until the voltage across capacitor 45A reaches prescribed voltage Vth, that is, delay time L of delay circuit 4212A, can be increased according to expression (6) by increasing the resistance value of capacitor 45A.

Capacitor 45A may be a capacitor having a variable capacitance value. Using a capacitor having a variable capacitance value allows capacitor 45A to have a capacitance value varied without replacing it with another capacitor to thus vary a delay time of delay circuit 4212A.

The overcurrent protective device according to the fourth embodiment can thus turn off FET 11 timely by a delay time set depending on the environment in which it is used. In other words, the present overcurrent protective device can implement a characteristic close to that of a fuse while being maintenance-free. As a result, the present overcurrent protective device can be used as a substitute for a fuse, that does not need to be replaced when it turns off FET 11.

In the first to fourth embodiments, a case where a tolerable current is set is described. However, setting a tolerable current is not essential. Hereinafter, a case where no tolerable current is set will be described.

Fifth Embodiment

Figure 18:
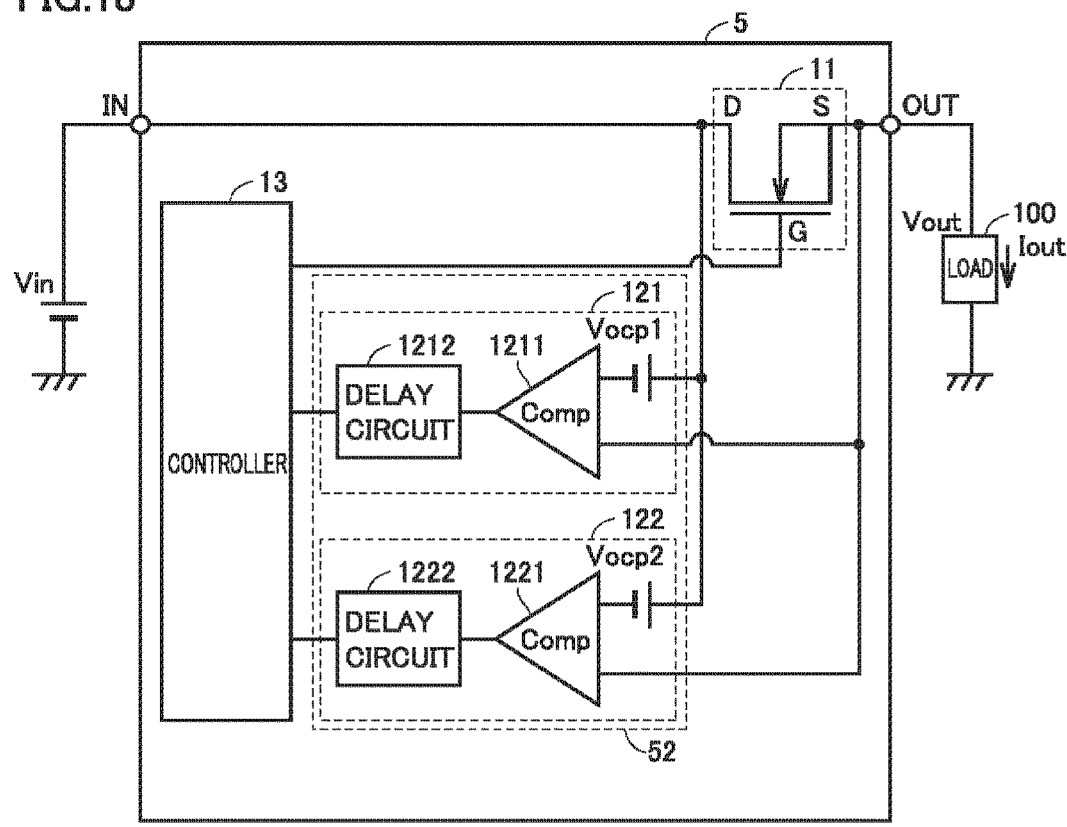
FIG. 18 is a functional block diagram for illustrating a function of an overcurrent protective device according to a fifth embodiment.

FIG. 18 is a functional block diagram for illustrating a function of an overcurrent protective device 5 according to a fifth embodiment. In overcurrent protective device 5 shown in FIG. 18, detector 22 of overcurrent protective device 1 shown in FIG. 2 is replaced with a detector 52. The configuration of detector 52 is a configuration where operational amplifier 1201 is removed from detector 22. The remainder in configuration is similar, and accordingly, it will not be described repeatedly.

Overcurrent protective device 5, as well as overcurrent protective device 1, can turn off FET 11 timely by a delay time provided stepwise depending on the magnitude of current Iout. In other words, overcurrent protective device 5 can implement a characteristic close to that of a fuse while being maintenance-free. As a result, overcurrent protective device 5 can be used as a substitute for a fuse, that does not need to be replaced when it turns off FET 11.

Fifth Embodiment in Exemplary Variation

In the fifth embodiment, a case where detector 52 includes two detection circuits is described. The number of the detection circuits which detector 52 includes is not limited to two. An exemplary variation of the fifth embodiment illustrates a case where detector 52 includes three or more detection circuits.

Figure 19:
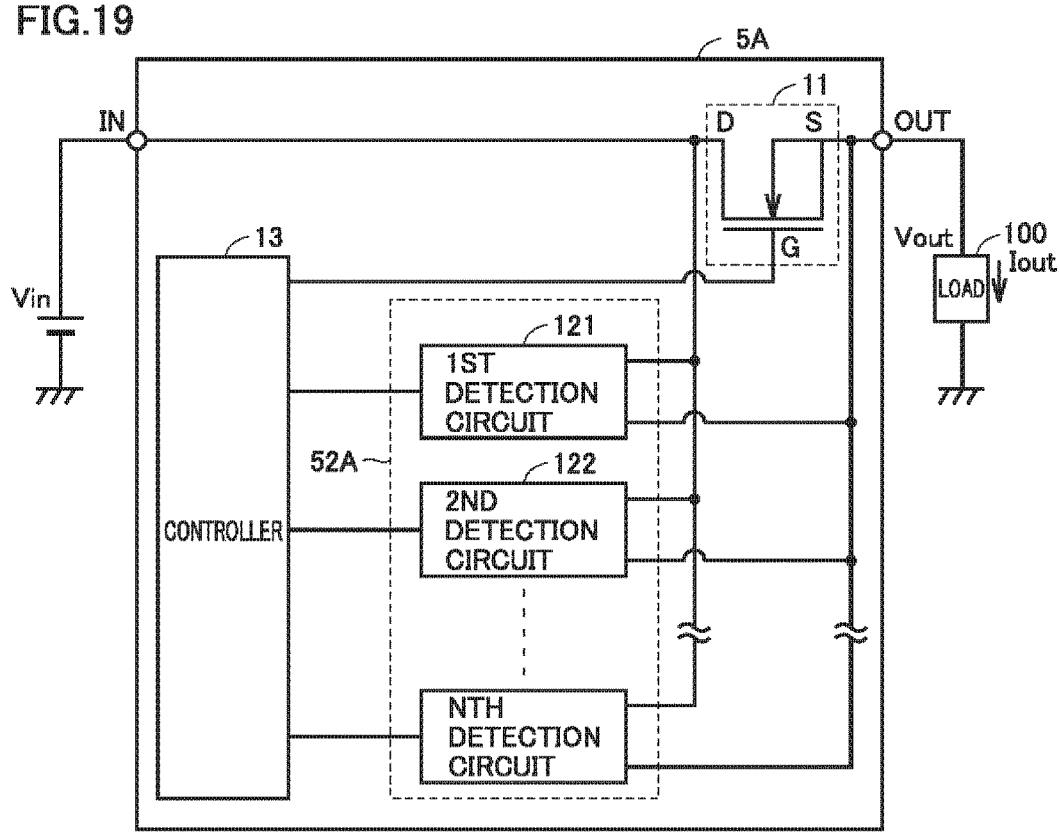
FIG. 19 is a functional block diagram for illustrating a function of an overcurrent protective device according to an exemplary variation of the fifth embodiment.

FIG. 19 is a functional block diagram for illustrating a function of an overcurrent protective device 5A according to the exemplary variation of the fifth embodiment. In overcurrent protective device 5A shown in FIG. 19, detector 22A of overcurrent protective device 1A shown in FIG. 6 is replaced with a detector 52A. The configuration of detector 52A is a configuration where operational amplifier 1201 is removed from detector 22A. The remainder in configuration is similar, and accordingly, it will not be described repeatedly.

Overcurrent protective device 5A, as well as overcurrent protective device 1A, can turn off FET 11 timely by a delay time provided stepwise depending on the magnitude of current Tout. In other words, overcurrent protective device 5A can implement a characteristic close to that of a fuse while being maintenance-free. As a result, overcurrent protective device 5A can be used as a substitute for a fuse, that does not need to be replaced when it turns off FET 11.

Overcurrent protective device 5A provided with the current's threshold value in three steps or more can have a characteristic closer to that of a fuse than overcurrent protective device 5 with the current's threshold value in two steps.

Sixth Embodiment

In the fifth embodiment a configuration is described in which detector 52 includes a plurality of detection circuits with different delay times to implement a delay time depending on the magnitude of current Tout. The method of implementing a delay time depending on the magnitude of current Tout is not limited to the method using the plurality of detection circuits with different delay times. In a sixth embodiment a case will be described in which a delay time is dynamically varied depending on current Tout.

Figure 20:
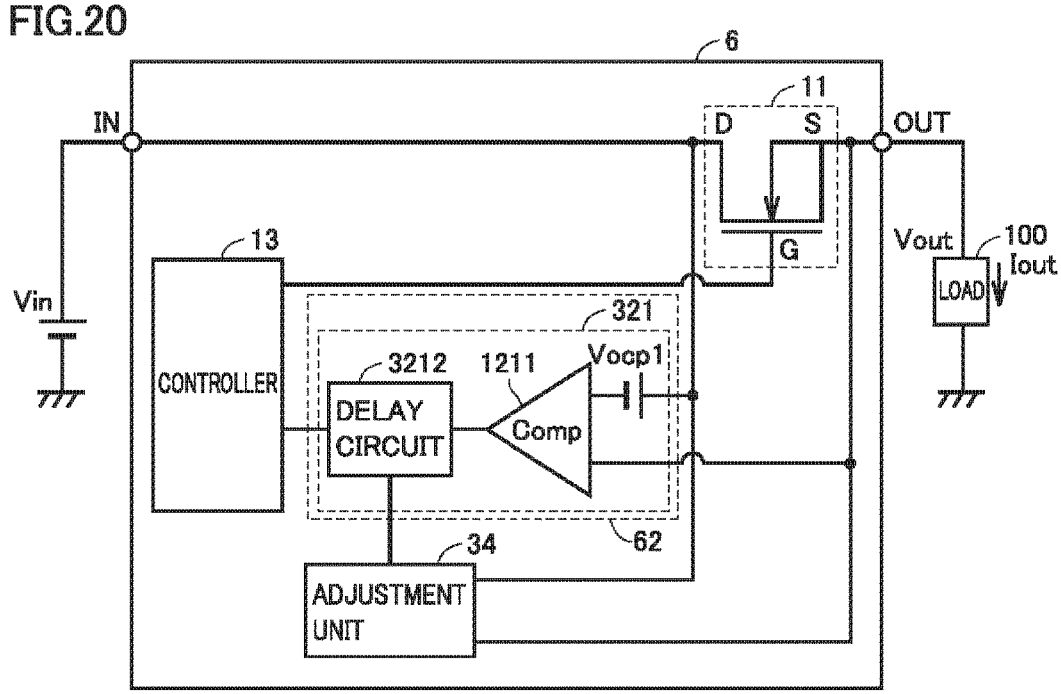
FIG. 20 is a functional block diagram for illustrating a function of an overcurrent protective device according to a sixth embodiment.

FIG. 20 is a functional block diagram for illustrating a function of an overcurrent protective device 6 according to the sixth embodiment. In overcurrent protective device 6 shown in FIG. 20, detector 32 of overcurrent protective device 3 shown in FIG. 11 is replaced with a detector 62. The configuration of detector 62 is a configuration where operational amplifier 1201 is removed from detector 32. The remainder in configuration is similar, and accordingly, it will not be described repeatedly.

Overcurrent protective device 6, as well as overcurrent protective device 3, can turn off FET 11 timely by setting a delay time variably depending on the magnitude of current Tout. In other words, overcurrent protective device 6 can implement a characteristic close to that of a fuse. As a result, overcurrent protective device 6 can be used as a substitute for the fuse.

Overcurrent protective device 6 can thus vary a delay time dynamically depending on current Tout, so that when it is compared with the overcurrent protective device according to the fifth embodiment having a delay time set stepwise overcurrent protective device 6 allows the delay time to vary smoothly and thus has a characteristic close to that of a fuse.

Seventh Embodiment

In the sixth embodiment the delay time is varied by the adjustment unit. However, the user of the overcurrent protective device cannot set the delay time. In the seventh embodiment a case will be described in which a delay circuit includes a component that is a resistor or a capacitor that can be varied by a user outside the overcurrent protective device and the delay circuit thus provides a variable delay time.

Figure 21:
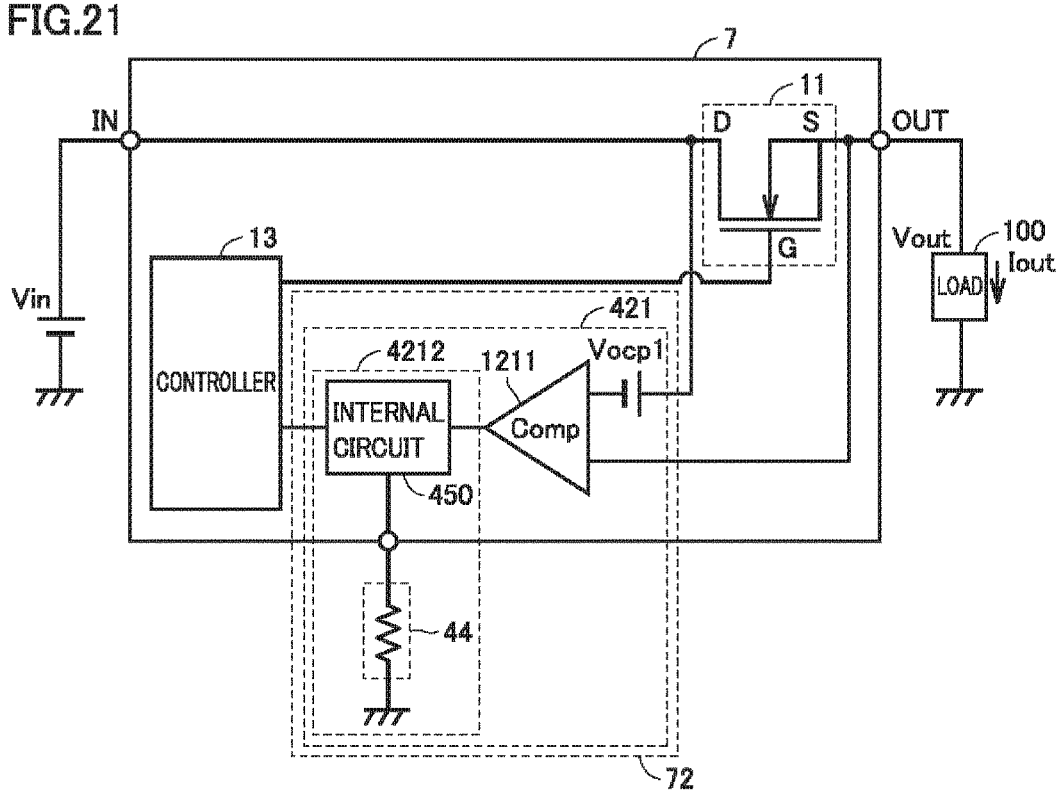
FIG. 21 is a functional block diagram for illustrating a function of an overcurrent protective device according to a seventh embodiment.

FIG. 21 is a functional block diagram for illustrating a function of an overcurrent protective device 7 according to the seventh embodiment. In overcurrent protective device 7 shown in FIG. 21, detector 42 of overcurrent protective device 4 shown in FIG. 14 is replaced with a detector 72. The configuration of detector 72 is a configuration where operational amplifier 1201 is removed from detector 42. The remainder in configuration is similar, and accordingly, it will not be described repeatedly.

Figure 22:
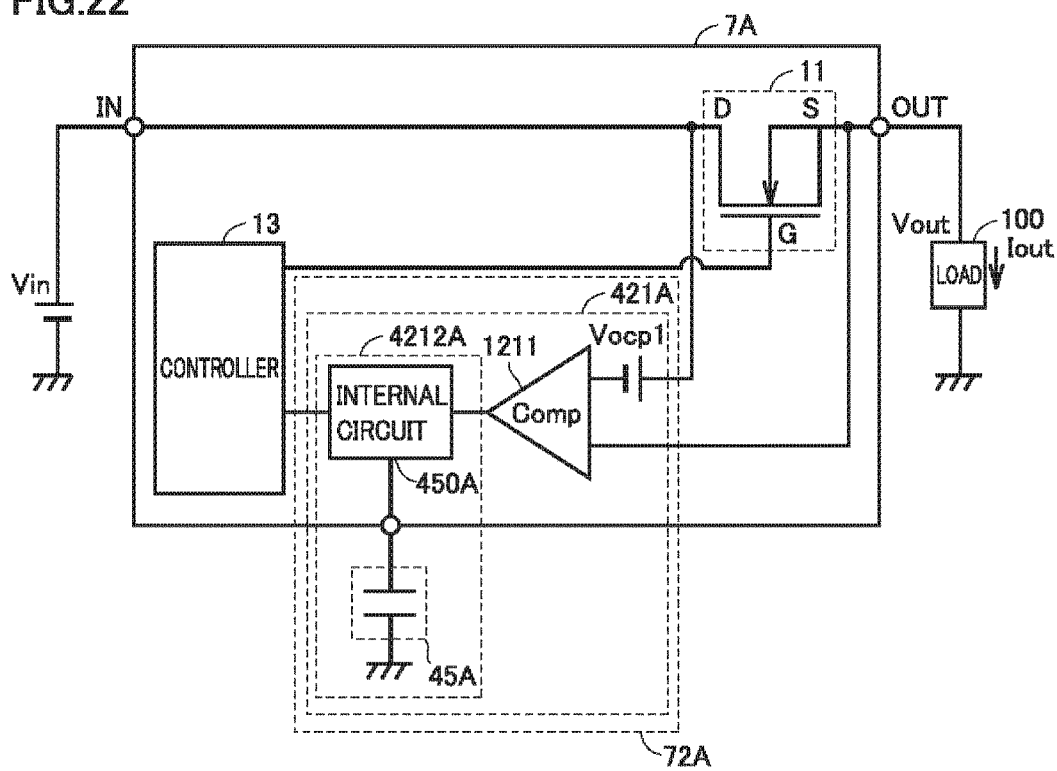
FIG. 22 is a functional block diagram for illustrating a function of another overcurrent protective device according to the seventh embodiment.

FIG. 22 is a functional block diagram for illustrating a function of another overcurrent protective device 7A according to the seventh embodiment. In overcurrent protective device 7A shown in FIG. 22, detector 42A of overcurrent protective device 4A shown in FIG. 16 is replaced with a detector 72A. The configuration of detector 72A is a configuration where operational amplifier 1201 is removed from detector 42A. The remainder in configuration is similar, and accordingly, it will not be described repeatedly.

The overcurrent protective device according to the seventh embodiment, as well as the overcurrent protective device according to the fourth embodiment, can turn off FET 11 timely by a delay time set depending on the environment in which it is used. In other words, the present overcurrent protective device can implement a characteristic close to that of a fuse while being maintenance-free. As a result, the present overcurrent protective device can be used as a substitute for a fuse, that does not need to be replaced when it turns off FET 11.

Eighth Embodiment

Figure 23:
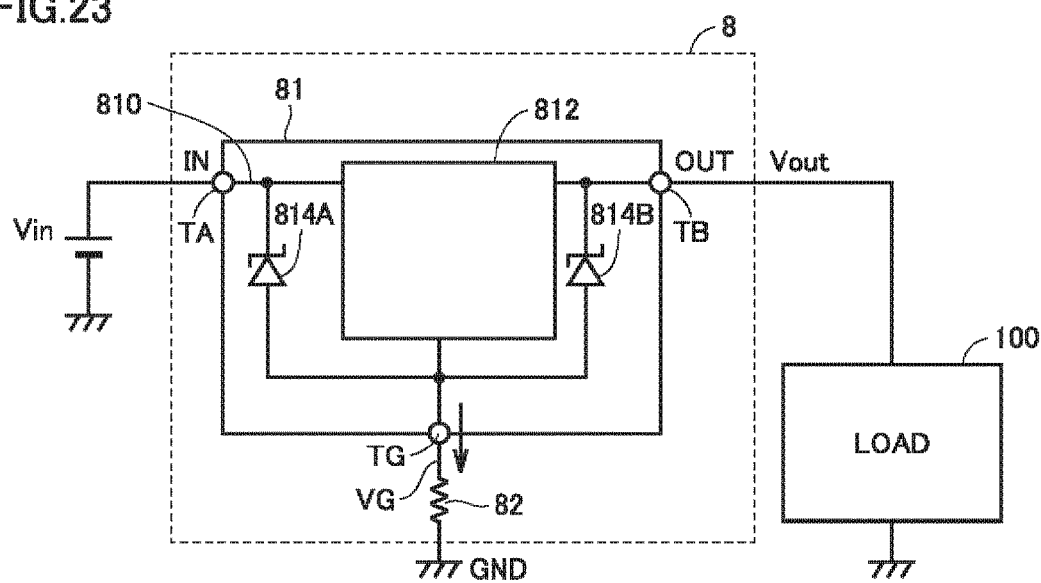
FIG. 23 is a schematic diagram showing a general configuration of an electronic apparatus according to an eighth embodiment.

FIG. 23 is a schematic diagram showing a general configuration of an electronic apparatus 8 according to an eighth embodiment. In FIG. 23, electronic apparatus 8 includes a circuit 81 and a resistor 82. Circuit 81 includes an input terminal TA, an output terminal TB, a ground terminal TG, and an internal circuit 812. Furthermore, circuit 81 may further include a first protection circuit 814A and a second protection circuit 814B.

Resistor 82 is connected between ground terminal TG and the ground. Resistor 82 limits a current which flows from circuit 81 via ground terminal TG to the ground.

Internal circuit 812 is connected between input terminal TA and output terminal TB, receives power supply voltage Vin from a power supply at input terminal TA and thus operates, and outputs voltage Vout from output terminal TB to load 100. For example, internal circuit 812 may be, but not limited to, a load switch configured to switch between supply and interruption of a voltage to load 100, or a voltage regulator.

A case will now be considered in which electronic apparatus 8 having the above configuration has internal circuit 812 destroyed by overvoltage or the like and thus having conduction failure. At the time, internal circuit 812 has an impedance close to 0 ohm, and accordingly, the current flows to the ground via input terminal TA, internal circuit 812, and ground terminal TG.

If resistor 82 is not present, then, with internal circuit 812 having low impedance, the power supply line would be almost grounded. Then, a large current can flow and serve as a cause of causing electronic apparatus 8 to generate heat.

In the present embodiment, by providing resistor 82 between a ground terminal and the ground, a current which flows through internal circuit 812 can be limited in magnitude by resistor 82. When the current which flows through ground terminal TG via the internal circuit has a value Ibias and resistor 82 has a resistance value R8, then, value Ibias has a relationship with power supply voltage Vin as follows: Ibias=Vin/R8. In the present embodiment, resistance value R8 is set to 100 ohms and power supply voltage Vin is set to 10 V for example. At the time, current value Ibias is limited to 100 mA. Resistance value R8 may be selected as appropriate such that a current generated when internal circuit 812 short-circuits has a desired magnitude or smaller.

Thus, by providing resistor 82 between ground terminal TG and the ground, a current which flows through internal circuit 812 when the internal circuit has conduction failure can be limited in magnitude by resistor 82.

The internal circuit's conduction failure can be caused by overvoltage, and accordingly, in the present embodiment, in order to prevent application of overvoltage to the internal circuit, a protection circuit 814 is further included.

First protection circuit 814A and second protection circuit 814B are used to maintain a voltage that is applied to internal circuit 812 at a prescribed voltage when an excessive voltage is applied to internal circuit 812. First protection circuit 814A and second protection circuit 814B are each a Zener diode for example. First protection circuit 814A has a cathode connected to input terminal TA and an anode connected to ground terminal TG. When a voltage larger than a prescribed magnitude is applied to input terminal TA, first protection circuit 814A conducts and passes a current to ground terminal TG. Second protection circuit 814B has a cathode connected to output terminal TB and an anode connected to ground terminal TG. When a voltage larger than a prescribed magnitude is applied to output terminal TB, second protection circuit 814B conducts and passes a current to ground terminal TG.

Thus, by providing protection circuit 814, application of overvoltage to the internal circuit can be suppressed.

Figure 24:
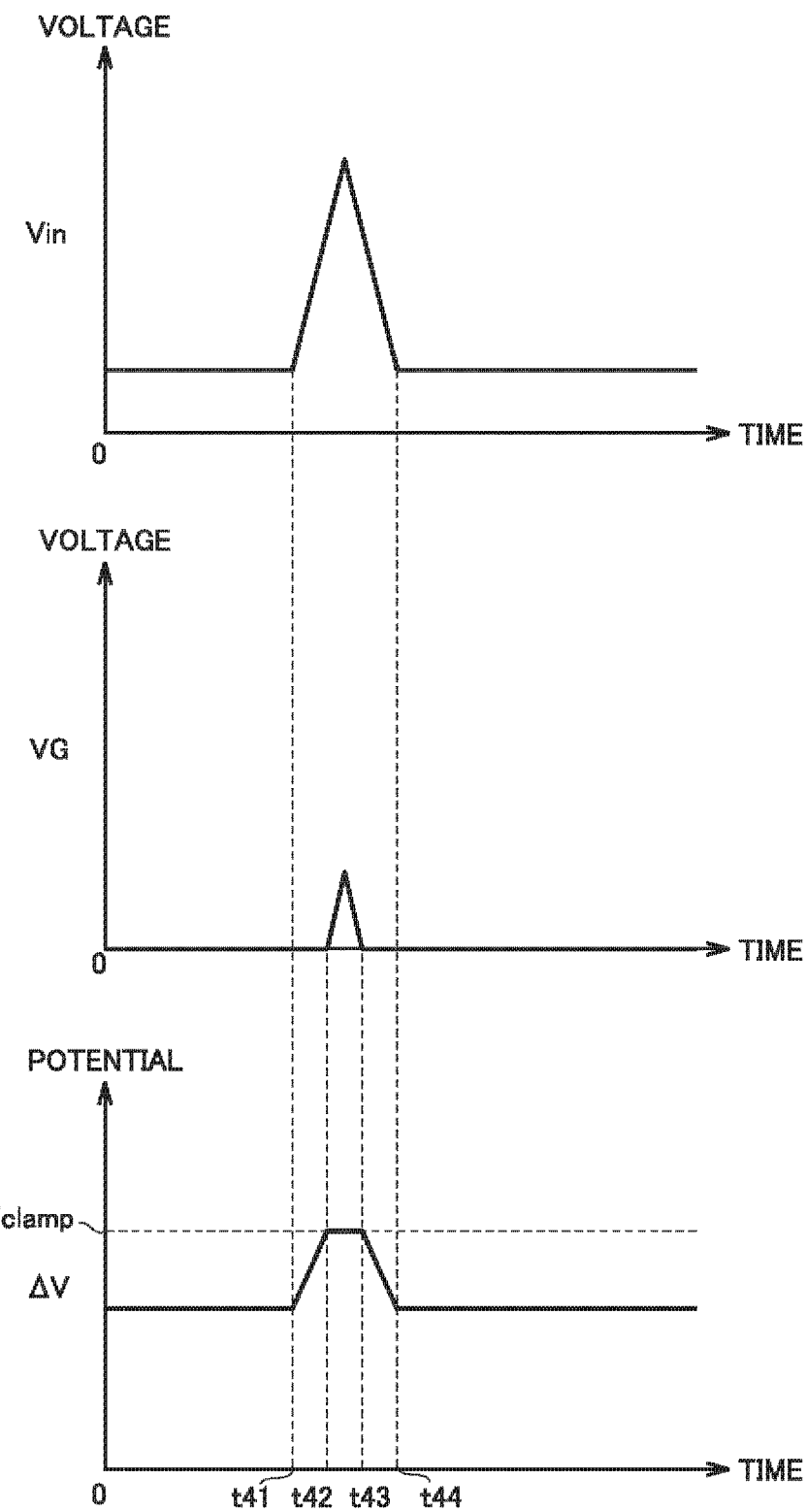
FIG. 24 is a time chart which shows a voltage applied to the electronic apparatus according to the eighth embodiment.

FIG. 24 is a time chart which shows how voltage Vin, voltage VG, and a potential ΔV vary in electronic apparatus 8 according to the eighth embodiment when an excessive voltage is input. In FIG. 24, the ordinate axis represents voltage Vin applied to input terminal TA, voltage VG applied to ground terminal TG, and potential ΔV between input terminal TA and ground terminal TG. In FIG. 24, the abscissa axis represents time.

Until time t41, a power supply applies a steady power supply voltage Vin to input terminal TA.

At time t41, for example a noise is generated at the power supply, and power supply voltage Vin input into input terminal TA starts to rapidly increase. At time t42, power supply voltage Vin exceeds a clamp voltage of first protection circuit 814A, that is, a voltage Vclamp, and in response, first protection circuit 814A conducts, and a voltage applied to first protection circuit 814A, that is, potential ΔV, is maintained at voltage Vclamp. At the time, voltage VG of ground terminal TG increases for a period of time from time t42 to time t43 only by a voltage corresponding a difference between Vin and voltage Vclamp.

Thus, when power supply voltage Vin has an overvoltage state, first protection circuit 814A suppresses application of overvoltage to the internal circuit and thus prevents the internal circuit from failing.

Furthermore, if first protection circuit 814A should be short-circuited by conduction failure, with first protection circuit 814A connected to ground terminal TG, a current which flows to the ground through first protection circuit 814A can be limited by resistor 82.

Thus, in the electronic apparatus according to the present invention, by providing a resistor on a path of a current from an interior of a circuit toward the ground, if an internal circuit has a conduction failure, a current which passes through the circuit can be limited.

Ninth Embodiment

Figure 25:
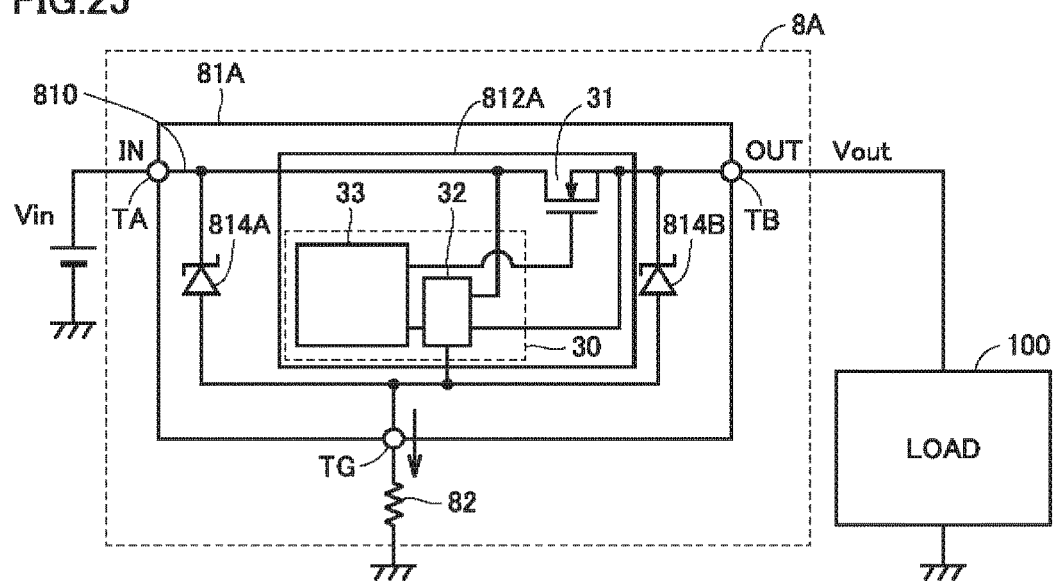
FIG. 25 is a schematic diagram showing a general configuration of an electronic apparatus according to a ninth embodiment.

FIG. 25 is a schematic diagram showing a general configuration when an electronic apparatus is a load switch. With reference to FIG. 25, an electronic apparatus 8A according to the present embodiment includes an internal circuit 812A including therein a switch 31 and a control circuit 30 for driving switch 31. Control circuit 30 includes detector 32 and controller 33. The remainder in configuration of electronic apparatus 8A according to the present embodiment is similar to a corresponding portion of electronic apparatus 8 according to the eighth embodiment, and accordingly will not be described repeatedly in detail.

Switch 31 is connected between input terminal TA and output terminal TB and controlled by control circuit 30 to switch between supply and interruption of a voltage from input terminal TA to output terminal TB. While in the present embodiment switch 31 is described as a MOSFET by way of example, switch 31 is not limited thereto and may be a bipolar transistor or any type of output transistor having an input and output terminal and a control terminal for controlling an input and an output. Switch 31 has a drain connected to input terminal TA, a source connected to output terminal TB, and a gate connected to controller 33.

Detector 32 is connected to the drain of switch 31 and the source of switch 31. Furthermore, detector 32 is connected to the ground via ground terminal TG. Detector 32 detects a current flowing through switch 31, based on a drain-source voltage of switch 31. Based on a comparison of the detected current with a prescribed threshold value, detector 32 determines whether an overcurrent is generated, and accordingly outputs a determination signal to controller 33.

In response to the result detected by detector 32, controller 33 outputs a gate drive signal for switch 31. More specifically, controller 33 turns off switch 31 when an overcurrent is generated, and controller 33 causes switch 31 to conduct when an overcurrent is not generated. Furthermore, after controller 33 turns off switch 31 and a prescribed period of time subsequently elapses, controller 33 may return switch 31 to the electrical conduction state.

If detector 32 is short-circuited by conduction failure, with detector 32 connected to ground terminal TG, electronic apparatus 8A can limit a current which flows to the ground through detector 32.

Thus, according to the electronic apparatus according to the present embodiment, if a conduction failure is caused, the value of a current which passes through a circuit is limited by a resistor, and the electronic apparatus can be prevented from generating heat or the like.

Tenth Embodiment

Figure 26:
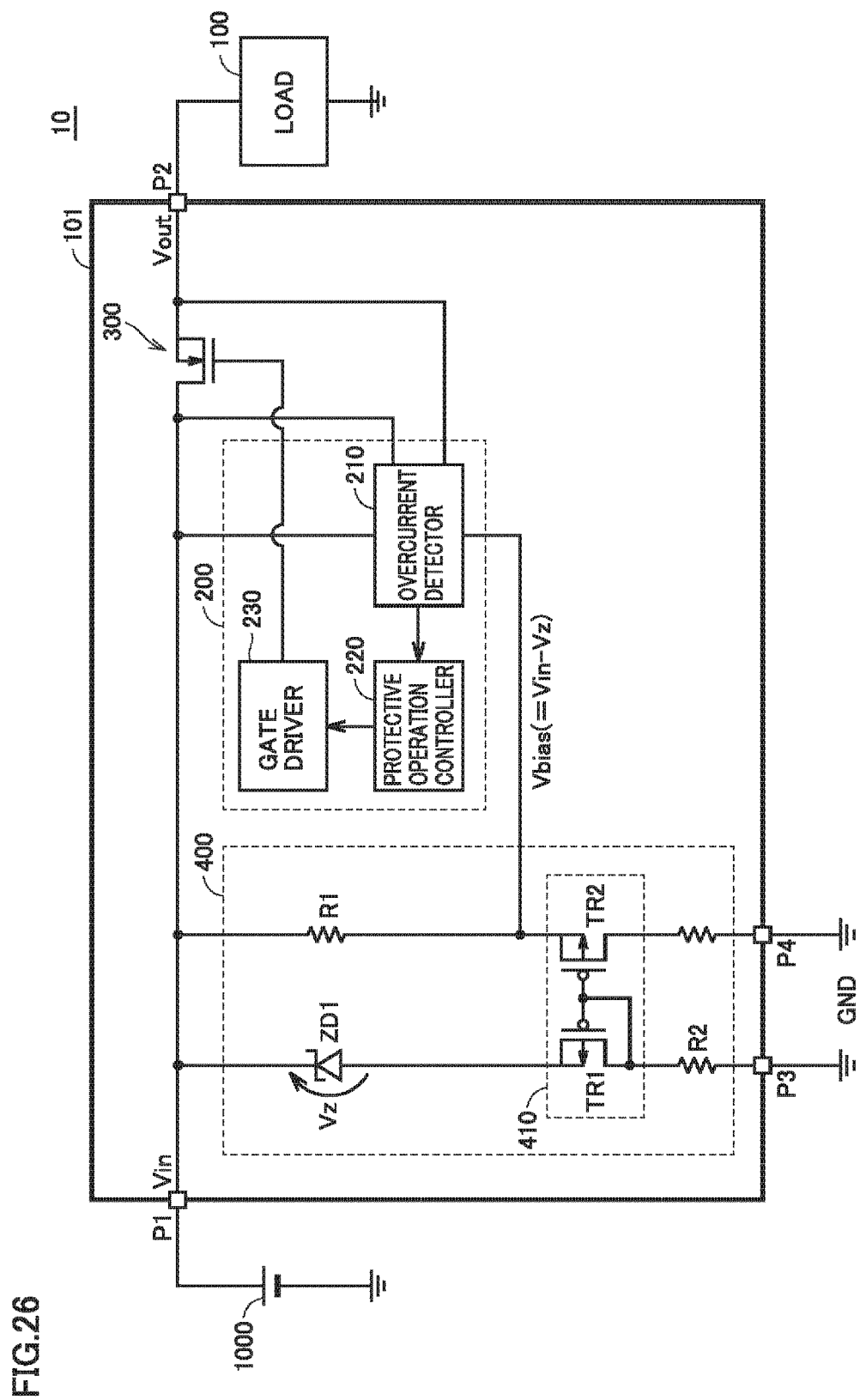
FIG. 26 is a general block diagram of an electronic apparatus including an overcurrent protective device according to a tenth embodiment.

FIG. 26 is a general block diagram of an electronic apparatus 10 including an overcurrent protective device 101 according to a tenth embodiment. With reference to FIG. 26, electronic apparatus 10 includes a direct current power supply 1000, load 100, and overcurrent protective device 101. Overcurrent protective device 101 includes an input terminal P1, an output terminal P2, a control device 200, a switch 300, and a bias circuit 400.

Overcurrent protective device 101 receives power supply voltage Vin from direct current power supply 1000 at input terminal P1, and outputs output voltage Vout from output terminal P2 to load 100.

Switch 300 can be a normally-on n type MOSFET, for example. Switch 300 has a drain electrically connected to input terminal P1 and a source electrically connected to output terminal P2. Switch 300 has a gate connected to control device 200 and, in response to a drive signal from control device 200, switches between supply and interruption of electric power from input terminal P1 to output terminal P2.

Note that switch 300 is not limited to the above configuration as long as it can switch between supply and interruption of electric power. Switch 300 can also be implemented as a bipolar transistor, a relay, etc., for example.

Control device 200 includes an overcurrent detector 210, a protective operation controller 220, and a gate driver 230.

Overcurrent detector 210 is connected to the drain and source of switch 300, and detects a current flowing through switch 300 based on how a voltage between the drain and the source varies. When overcurrent detector 210 detects a current exceeding a prescribed threshold value, overcurrent detector 210 determines that an overcurrent is supplied to load 100, and overcurrent detector 210 outputs an overcurrent detection signal to protective operation controller 220.

In response to the overcurrent detection signal from overcurrent detector 210, protective operation controller 220 generates a drive command for driving switch 300, and outputs it to gate driver 230. In protective operation controller 220, for example, a delay time after an overcurrent is detected until switch 300 is actually operated, a returning time after switch 300 operates, etc. can be set.

In response to the drive command from protective operation controller 220, gate driver 230 outputs a drive signal for switch 300.

Thus, when an overcurrent is flowing from direct current power supply 1000 to load 100, overcurrent protective device 101 can turn off switch 300 to prevent an excessive current from continuing to flow to load 100.

Bias circuit 400 is a circuit for outputting a bias voltage Vbias to overcurrent detector 210 of control device 200. Bias voltage Vbias is an intermediate voltage between power supply voltage Vin and ground voltage GND, and for example for Vin=20 V, bias voltage Vbias is set to 10 V or the like. Note that bias voltage Vbias is not limited to one half of the voltage between power supply voltage Vin and ground voltage GND, and depending on a specification of an element to be used, bias voltage Vbias can set to any voltage between power supply voltage Vin and ground voltage GND. For example for Vin=20 V, Vbias=5 V may be set.

Figure 27:
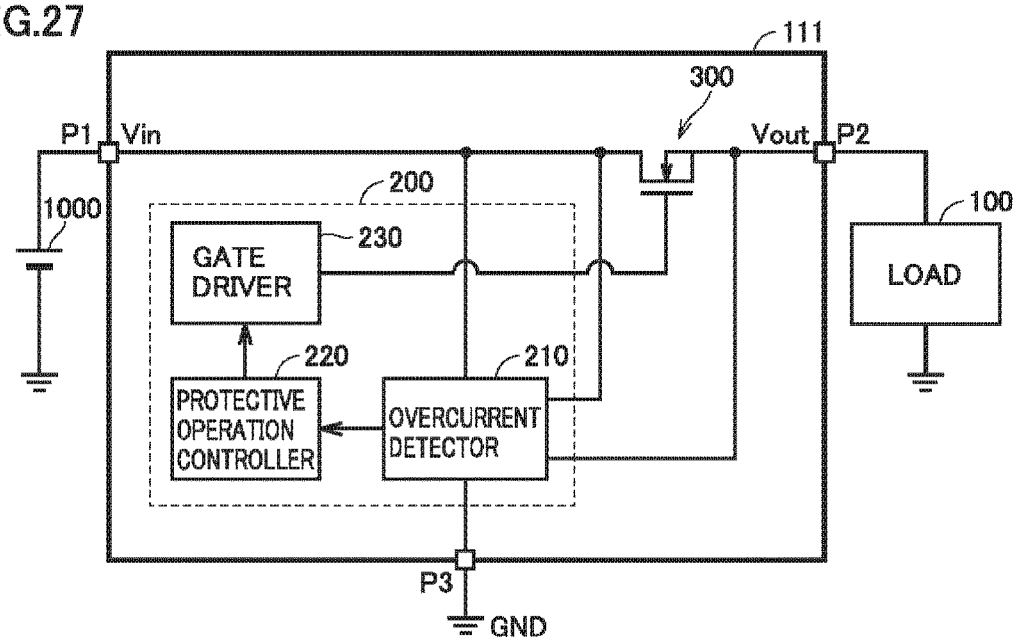
FIG. 27 is a block diagram of an overcurrent protective device of a comparative example 1.

For example, when overcurrent detector 210 is connected directly to ground voltage GND, as shown in FIG. 27 showing an overcurrent protective device 111 in a comparative example 1, overcurrent detector 210 needs to have a withstand voltage which can endure power supply voltage Vin.

Accordingly, it is necessary to configure overcurrent detector 210 such that an element of a circuit configuring it accommodates high withstand voltage when power supply voltage Vin increases.

Generally, an element accommodating high withstand voltage requires having an increased element size, and accordingly, a circuit which uses the high withstand voltage element has a larger circuit area than a circuit which uses a low withstand voltage element. This can result in the element and the entire device becoming large in size, and the production cost also being increased.

Furthermore, there is a case in which the high withstand voltage element is prone to have characteristics varying more than the low withstand voltage element, and using the high withstand voltage element may result in poor detection accuracy.

In the tenth embodiment shown in FIG. 26, the voltage provided to overcurrent detector 210 can be relatively reduced by supplying bias voltage Vbias intermediate between power supply voltage Vin and ground voltage GND to overcurrent detector 210. More specifically, the withstand voltage of overcurrent detector 210 can be reduced to Vin−Vbias. By lowering the withstand voltage of overcurrent detector 210, the circuit scale can be reduced, and the cost can be reduced and the current detection accuracy can be improved.

In the tenth embodiment shown in FIG. 26, an example is shown in which a clamping circuit is used as bias circuit 400. Bias circuit 400 includes a Zener diode ZD1, resistors R1 and R2, and a current mirror 410.

Current mirror 410 includes switches TR1 and TR2 of the same specification shown by two P type MOSFETs. A gate of switch TR1 is connected to a gate of switch TR2 and is also connected to a source of switch TR1.

Zener diode ZD1 has a cathode connected to input terminal P1 and an anode connected to a drain of switch TR1. Switch TR1 has the source connected to the ground via resistor R2.

Resistor R1 has one end connected to input terminal P1 and the other end connected to a drain of switch TR2. Switch TR2 has a source connected to the ground. Furthermore, switch TR2 has the drain also connected to overcurrent detector 210.

By this configuration, when input voltage Vin exceeds breakdown voltage Vz of Zener diode ZD1 a current flows through switch TR1, and by current mirror 410, a current of the same magnitude also flows through switch TR2.

At the time, when switch TR1's gate-drain voltage is Vth11, the gate's voltage is Vin−Vz−Vth11. Since switch TR1 and switch TR2 are of the specification, a voltage at the drain of switch TR2 (that is, bias voltage Vbias) is represented as follows:

$$V\text{bias} = V\text{in} - Vz - V{th}11 + V{th}11 = V\text{in} - Vz \qquad (7).$$

A withstand voltage required for overcurrent detector 210 is expressed by an expression (8):

$$V\text{in} - V\text{bias} = V\text{in} - (V\text{in} - Vz) = Vz \qquad (8).$$

In other words, the withstand voltage of overcurrent detector 210 can be adjusted by appropriately selecting the breakdown voltage of Zener diode ZD1.

Note that overcurrent protective device 101 can also be formed as an integrated circuit.

Tenth Embodiment in First Exemplary Variation

While in the tenth embodiment a case in which a clamping circuit is used as a bias circuit is described as an example, the bias circuit is not limited to the above described configuration, and a different configuration can also be used that can output a prescribed voltage lowered relative to input voltage Vin.

Figure 28:
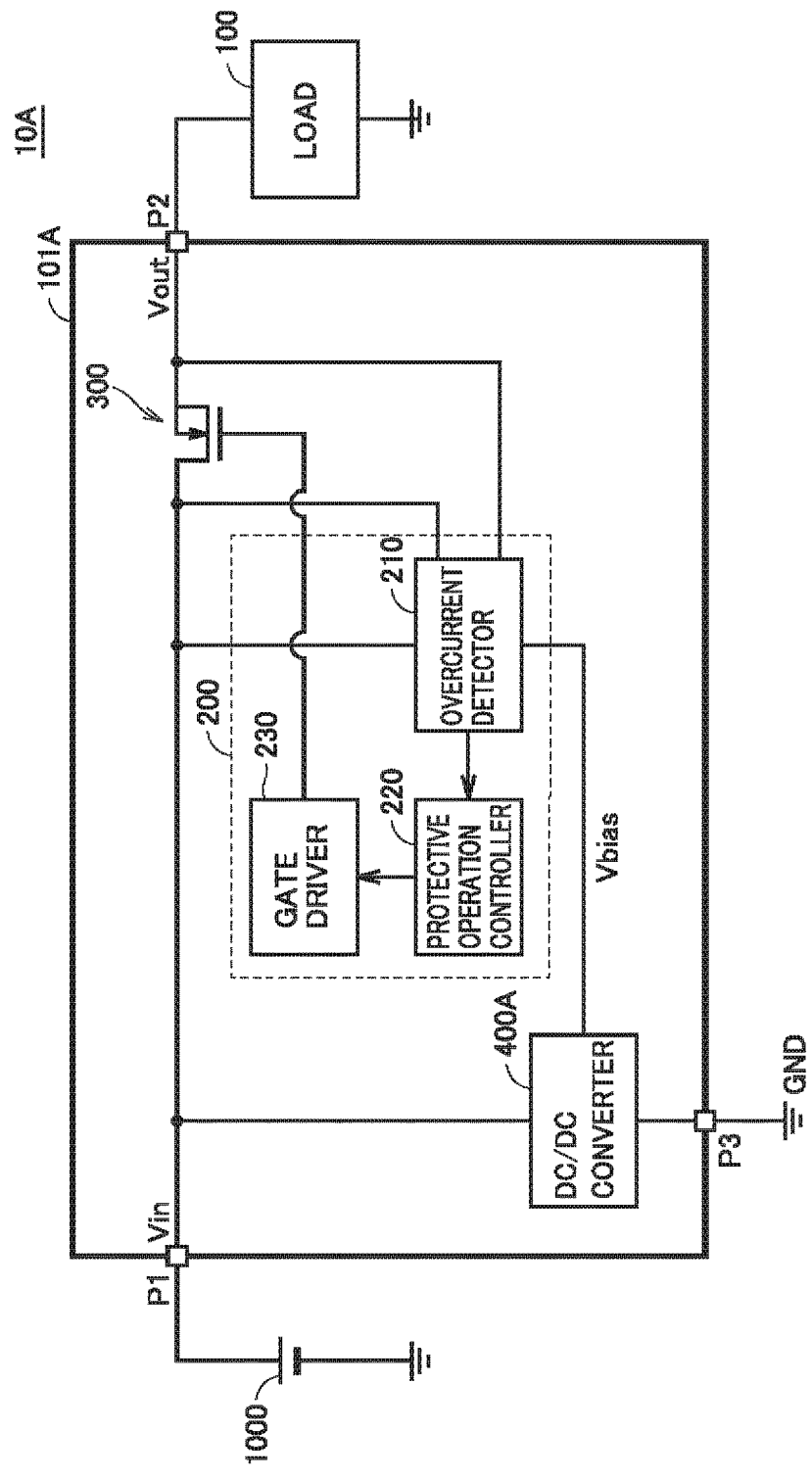
FIG. 28 is a general block diagram of an electronic apparatus including an overcurrent protective device according to a first exemplary variation of the tenth embodiment.

FIG. 28 is a general block diagram of an electronic apparatus 10A including an overcurrent protective device 101A according to a first exemplary variation of the tenth embodiment. In overcurrent protective device 101A of FIG. 28, a DC/DC converter 400A is used rather than the clamping circuit of FIG. 26. Note that overcurrent protective device 101A will not be described for components identical to those shown in FIG. 26.

With reference to FIG. 28, DC/DC converter 400A is connected between input terminal P1 and the ground. DC/DC converter 400A receives input voltage Vin from input terminal P1, lowers input voltage Vin to obtain voltage Vbias, and outputs voltage Vbias to overcurrent detector 210.

In this configuration also, the withstand voltage of overcurrent detector 210 can be reduced.

Tenth Embodiment in Second Exemplary Variation

Figure 29:
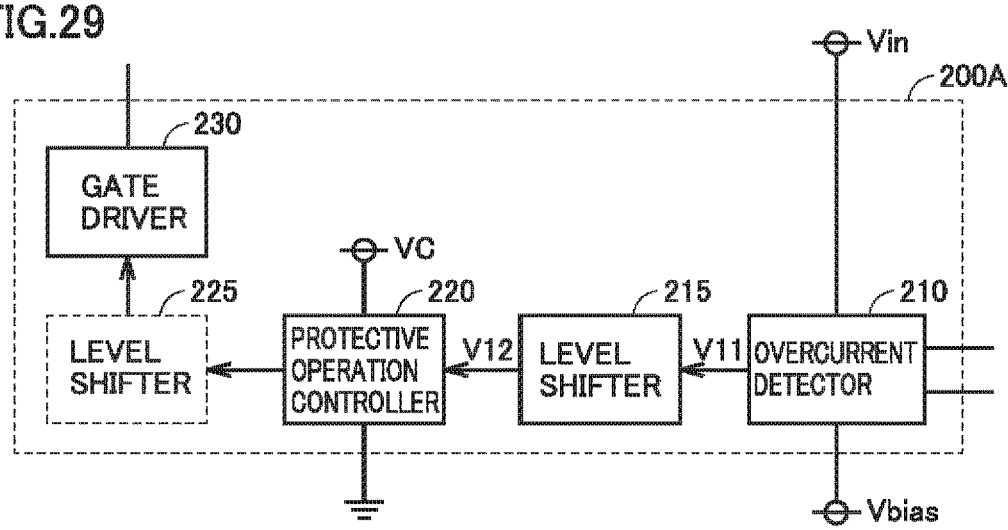
FIG. 29 is a block diagram showing an example of a control device including a level shifter.

FIG. 29 shows an exemplary variation of the control device, and FIG. 29 shows a control device 200A including a level shifter 215 between overcurrent detector 210 and protective operation controller 220.

Even when the withstand voltage of overcurrent detector 210 is reduced by the bias circuit, as described above, there can be a case in which overcurrent detector 210 outputs a signal having a voltage level different from a voltage level used in protective operation controller 220. For example, when protective operation controller 220 is driven by a controlling power supply voltage VC (for example, of 5 V), and overcurrent detector 210 outputs a signal having a voltage level V11 (for example, of 10 V), level shifter 215 converts voltage level V11 to a voltage level V12 (<5 V).

By using such a level shifter 215, if overcurrent detector 210 outputs a signal having a voltage level different from a voltage level used in protective operation controller 220, the difference in voltage can be adjusted as appropriate. Therefore, overcurrent detector 210 and protective operation controller 220 can be selected from a large number of design variations depending on the application, with cost and element size taken into consideration.

Note that when the voltage level of protective operation controller 220 is different from the voltage level of gate driver 230, a level shifter 225 may furthermore be provided between protective operation controller 220 and gate driver 230.

Thus, in the overcurrent protective device according to tenth embodiment, a bias circuit is provided for supplying an intermediate voltage between an input voltage and a ground voltage to an overcurrent detector in a control device. Thus, if the input voltage is relatively high, the withstand voltage of a circuit configuring the overcurrent detector can be reduced and the circuit scale of the overcurrent detector can be reduced. This allows the device as a whole to be reduced in size and hence cost and also allows the overcurrent detector to have improved detection accuracy.

Eleventh Embodiment

Figure 30:
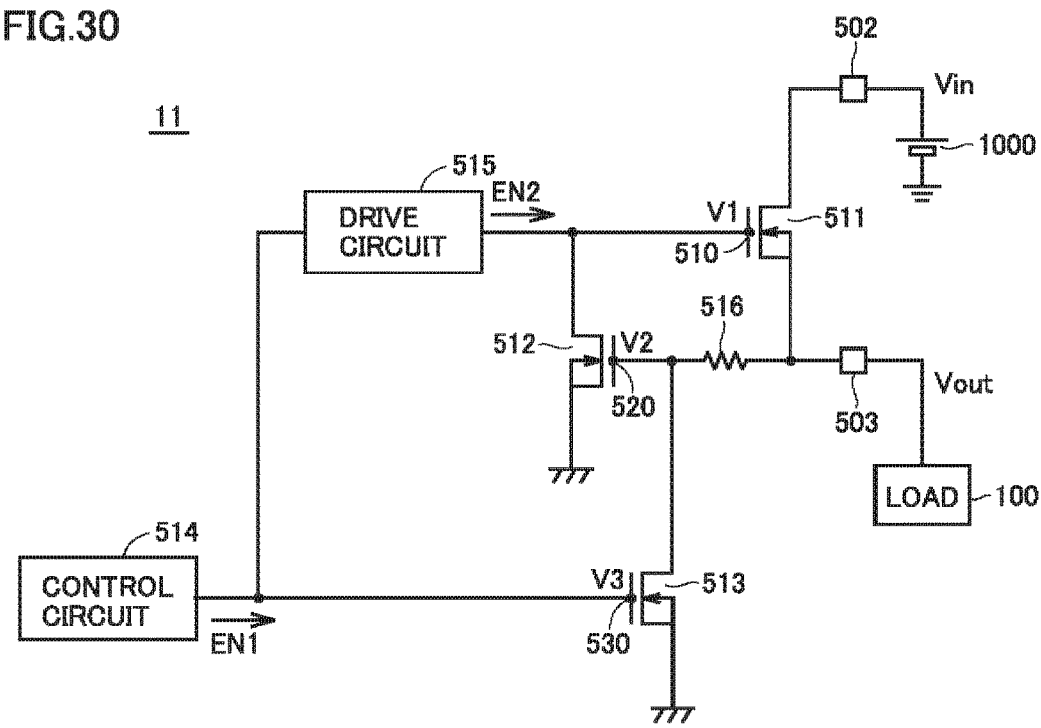
FIG. 30 is a schematic diagram showing a general configuration of a signal transmission circuit according to an eleventh embodiment.

FIG. 30 is a schematic diagram showing a general configuration of a signal transmission circuit 11 according to an eleventh embodiment. With reference to FIG. 30, signal transmission circuit 11 includes an input terminal 502, an output terminal 503, a first switch 511, a second switch 512, a third switch 513, a control circuit 514, a drive circuit 515, and a resistor 516.

The signal transmission circuit receives power supply voltage Vin from a power supply 1000 at input terminal 502, and outputs output voltage Vout from output terminal 503 to load 100.

While hereinafter each switch is described as a MOSFET by way of example, each switch may be a bipolar transistor or any type of output transistor having an input and output terminal and a control terminal for controlling an input and an output.

First switch 511 is provided between input terminal 502 and output terminal 503 and switches an electrical conduction state between input terminal 502 and output terminal 503. In the eleventh embodiment, a drain of first switch 511 is electrically connected to input terminal 502 and a source of first switch 511 is electrically connected to output terminal 503. A first control terminal 510 that is a gate of first switch 511 is electrically connected to drive circuit 515. Thus, in response to a drive signal EN2 received from drive circuit 515, first switch 511 switches between transmission and interruption of a voltage from input terminal 502 to output terminal 503.

Drive circuit 515 is connected to first control terminal 510, generates drive signal EN2 for driving first switch 511, and outputs it to first control terminal 510.

Control circuit 514 is connected to drive circuit 515, generates a control signal EN1 for driving drive circuit 515, and outputs it to drive circuit 515.

Second switch 512 is a switch for pulling first control terminal 510 to the low level when first switch 511 does not conduct. A drain of second switch 512 is electrically connected to first control terminal 510 and a source of second switch 512 is electrically connected to the ground. A second control terminal 520 that is a gate of second switch 512 is electrically connected to output terminal 503 via resistor 516. Thus, when a voltage V2 applied to second control terminal 520 exceeds a threshold voltage Vth22 of second switch 512, second switch 512 conducts and connects first control terminal 510 to the ground.

Third switch 513 is a switch for bringing second switch 512 out of conduction when control signal EN1 is output. In the eleventh embodiment, third switch 513 has a drain connected to second control terminal 520 and a source connected to the ground. A third control terminal 530 that is a gate of third switch 513 is connected to control circuit 514 and driven by control signal EN1. Thus, when control signal EN1 is output and first switch 511 conducts, third switch 513 brings second switch 512 out of conduction to hold to the high level a voltage V1 applied to first control terminal 510.

[Comparative Example 2]

Figure 31:
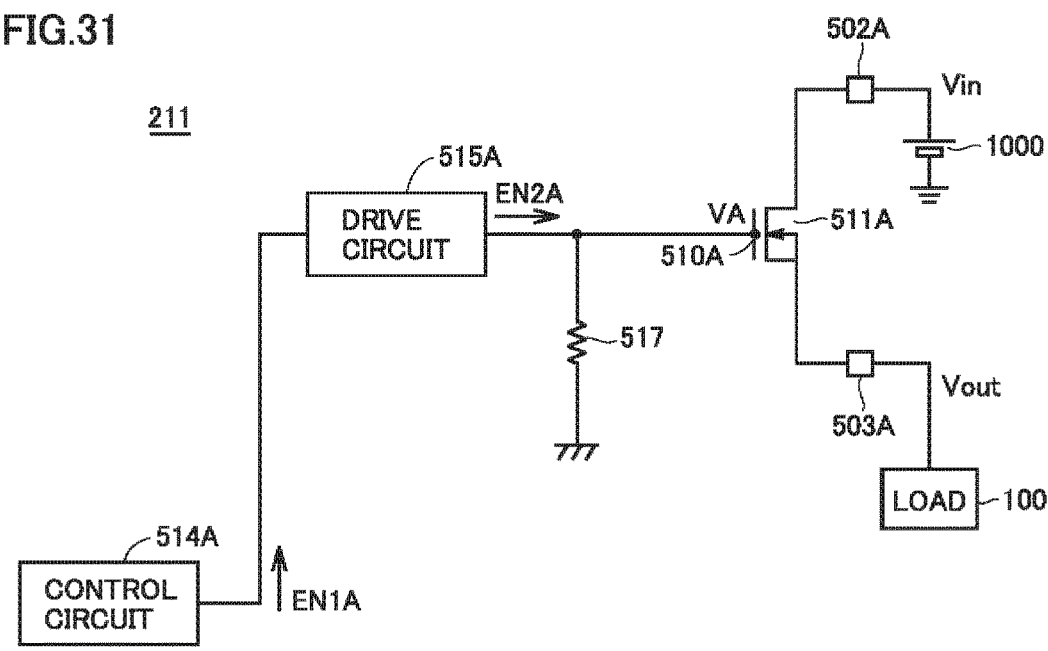
FIG. 31 is a schematic diagram showing a general configuration of a signal transmission circuit according to a comparative example 2.

FIG. 31 is a schematic diagram showing a general configuration of a signal transmission circuit according to a comparative example 2. With reference to FIG. 31, a signal transmission circuit 211 includes an input terminal 502A, an output terminal 503A, a switch 511A, a control circuit 514A, a drive circuit 515A, and a resistor 517.

Signal transmission circuit 211 receives power supply voltage Vin from power supply 1000 at input terminal 502A, and outputs output voltage Vout from output terminal 503A to load 100.

Switch 511A is provided between input terminal 502A and output terminal 503A and switches an electrical conduction state between input terminal 502A and output terminal 503A. In the eleventh embodiment, switch 511A is a MOSFET. Switch 511A has a drain electrically connected to input terminal 502A and a source electrically connected to output terminal 503A. A control terminal 510A that is a gate of switch 511A is electrically connected to drive circuit 515A. Thus, in response to a drive signal EN2A received from drive circuit 515A, switch 511A switches between transmission and interruption of a voltage from input terminal 502A to output terminal 503A.

Drive circuit 515A is connected to control terminal 510A, generates drive signal EN2A for driving switch 511A, and outputs it to control terminal 510A.

Control circuit 514A is connected to drive circuit 515A, generates a control signal EN1A for driving drive circuit 515A, and outputs it to drive circuit 515A.

Resistor 517 is provided between control terminal 510A and the ground. Resistor 517 is a pull down resistor for pulling control terminal 510A to the low level. Resistor 517 brings switch 511A out of conduction when drive circuit 515A does not output drive signal EN2A.

An operation of signal transmission circuit 211 having the above described configuration will now be described for a case with switch 511A driven and a case with switch 511A not driven.

When switch 511A is driven, control circuit 514A for example receives a request from a user to activate load 100, and generates and outputs control signal EN1A. Drive circuit 515A receives control signal EN1A, and generates and outputs drive signal EN2A. In response to drive signal EN2A, voltage V1 to control terminal 510A rises to the high level. Thus, switch 511A conducts.

Once switch 511A conducts, input terminal 502A and output terminal 503A are electrically connected via switch 511A. This transmits voltage from power supply 1000 to load 100. Resistor 517 receives voltage VA and consumes electric power. Between an amount of electric power P consumed by resistor 517 and a resistance value R12 of resistor 517, a relationship of $P=VA^2/R12$ holds, and the smaller resistance value R12 of resistor 517 is, the larger amount of electric power P is.

For example, when a request to stop load 100 is received from the user, control circuit 514A stops outputting control signal EN1A. Accordingly, drive circuit 515A stops outputting drive signal EN2A. Control terminal 510A is grounded via resistor 517 and falls to the low level. Accordingly, switch 511A ceases to conduct and thus interrupts transmission of voltage from power supply 1000 to load 100.

In this state, when a leakage current is caused from drive circuit 515A, resistor 517 dissipates the leakage current to the ground. However, voltage VA increases under an effect of a voltage drop by resistor 517. When voltage VA exceeds threshold voltage VthA of switch 511A, switch 511A conducts. Switch 511A brought into conduction erroneously transmits voltage Vin to load 100. Resistance value R12 having a larger value increases the voltage drop's effect and facilitates voltage VA to be high, and erroneous transmission of a voltage by a noise easily occurs. Resistance value R12 having a small value reduces the voltage drop's effect and erroneous transmission of a voltage by a noise less easily occurs, however, as has been discussed above, signal transmission circuit 211 has an increased power consumption.

Thus, in signal transmission circuit 211 according to comparative example 2, it is difficult to achieve both reduction of power consumption and suppression of erroneous signal transmission.

Accordingly, signal transmission circuit 11 according to the eleventh embodiment described with reference to FIG. 30 does not use a pull down resistor and instead uses second switch 512 and third switch 513. Signal transmission circuit 11 can thus achieve both reduction of power consumption and prevention of erroneous signal transmission causing a load to erroneously operate.

Figure 32:
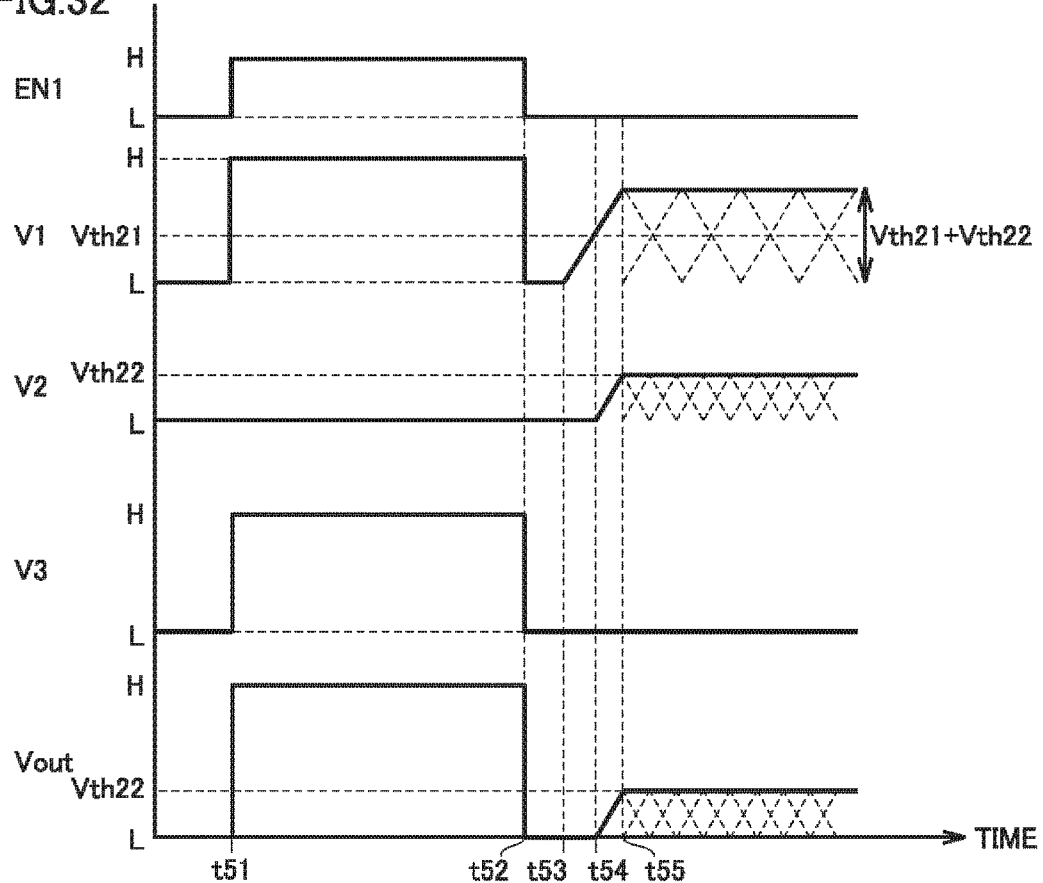
FIG. 32 shows an example of how a voltage at a control terminal of each switch varies in response to a control signal of the signal transmission circuit according to the eleventh embodiment.

FIG. 32 shows an example of how a voltage at a control terminal of each switch varies in response to a control signal of signal transmission circuit 11 according to the eleventh embodiment. In FIG. 32, the ordinate axis represents control signal EN1 which control circuit 514 outputs, voltage V1 applied to first control terminal 510, voltage V2 applied to second control terminal 520, voltage V3 applied to third control terminal 530, and output voltage Vout applied to output terminal 503. In FIG. 32, the abscissa axis represents time.

With reference to FIG. 30 and FIG. 32, at time t51, a request is received from a user to activate first switch 511, and in response, control circuit 514 starts outputting control signal EN1. Drive circuit 515 receives control signal EN1 and starts outputting drive signal EN2. Thus, voltage V1 rises to the high level and first switch 511 conducts.

Furthermore, in response to control signal EN1 from control circuit 514, voltage V3 also rises to the high level and third switch 513 conducts.

Second control terminal 520 is connected to the ground via third switch 513, and accordingly, voltage V2 has the low level. Accordingly, second switch 512 does not conduct. At this time, output terminal 503 is connected to the second switch via resistor 516. Resistor 516 is high impedance. Accordingly, output terminal 503 and the ground do not short-circuit, and output terminal 503 can receive power supply voltage via first switch 511.

At time t52, for example a request is received from the user to stop first switch 511, and in response, control circuit 514 stops outputting control signal EN1. As control signal EN1 is stopped, drive circuit 515 stops outputting drive signal EN2. Voltage V1 falls to the low level, and first switch 511 ceases to conduct.

As control signal EN1 from control circuit 514 is stopped, voltage V3 also falls to the low level. Accordingly, third switch 513 ceases to conduct.

As first switch 511 interrupts transmission of the power supply voltage to output terminal 503, voltage V2 has the low level. Accordingly, second switch 512 does not conduct.

In this state, at time t53, it is assumed that a leakage current is generated from drive circuit 515. The leakage current increases voltage V1 via the parasitic capacitance of first switch 511.

At time t54, voltage V1 reaches threshold voltage Vth21 of the first control terminal, and in response, first switch 511 conducts, and as voltage V1 increases, a voltage is transmitted from input terminal 502 to output terminal 503.

At the time, control signal EN1 has the low level, and accordingly, third switch 513 does not conduct and voltage V2 receives output voltage Vout and thus increases. When output voltage Vout becomes larger than threshold voltage Vth22 of second switch 512, second switch 512 conducts.

Thus, first control terminal 510 is grounded via second switch 512 (time t55). At the time voltage V1 has a value of approximately Vth21+Vth22. When voltage V1 is held substantially constant, voltage V2 is also held at threshold voltage Vth22, and second switch 512 maintains an electrical conduction state. At the time, as well as voltage V2, output voltage Vout is held at about threshold voltage Vth22. In contrast, as indicated in FIG. 32 by a dotted line, when voltage V1 decreases, the output voltage and voltage V2 decrease below threshold voltage Vth22, and second switch 512 ceases to conduct. However, when second switch 512 ceases to conduct, voltage V1 increases again. And when output voltage Vout and voltage V2 increase in response to voltage V1 to threshold voltage Vth22 again, second switch 512 conducts again. In other words, voltage V1 has a value repeating increasing and decreasing between a value of about Vth21+Vth22 and the low level, and in response thereto, voltage V2 and the output voltage repeat increasing and decreasing between threshold voltage Vth22 and the low level. Accordingly, the voltage supplied to output terminal 503 via first switch 511 is suppressed to a magnitude within threshold voltage Vth22 whether voltage V1 may be held substantially constant or increase or decrease. Thus, erroneous transmission of voltage from input terminal 502 to output terminal 503 is suppressed to a magnitude within threshold voltage Vth22.

Thus, if erroneous transmission of voltage is caused by a leakage current flowing to first control terminal 510, a noise or the like while drive signal EN2 is stopped, signal transmission circuit 11 configured as shown in FIG. 30 can maintain output voltage Vout to output terminal 503 at a low voltage to suppress erroneous transmission of power supply voltage Vin capable of activating a load and thus prevent the load's erroneous operation.

[Example of Application]

Figure 33:
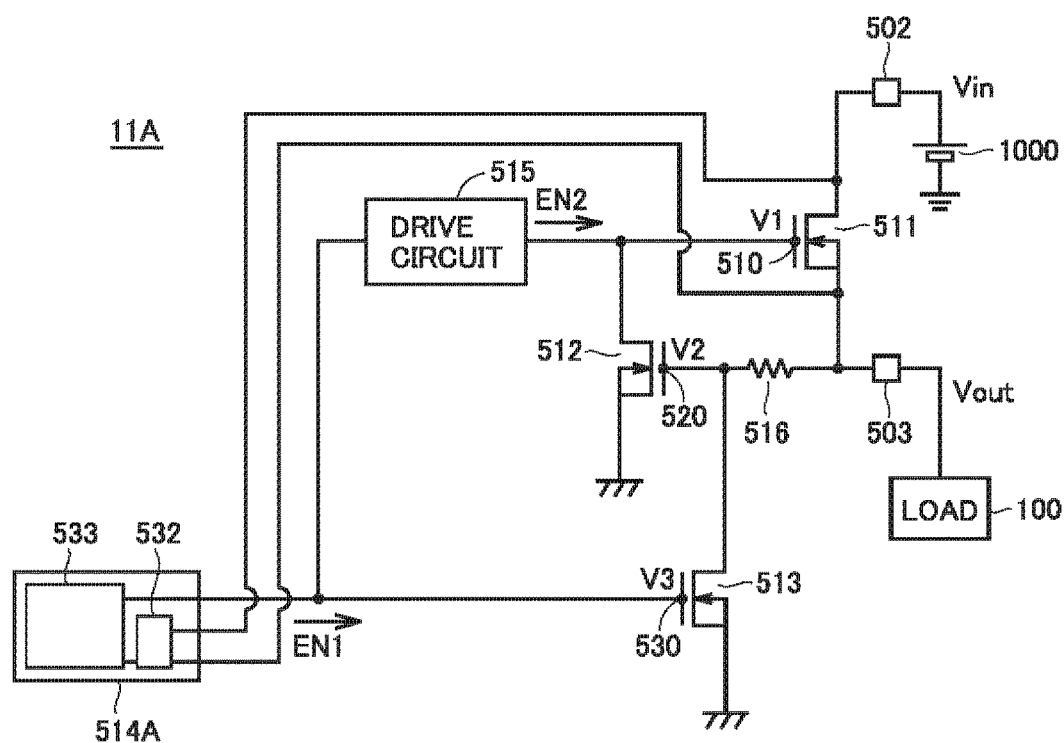
FIG. 33 is a schematic diagram showing a general configuration of an example in which the signal transmission circuit according to the eleventh embodiment is applied to an overcurrent protective device.

FIG. 33 is a schematic diagram showing a general configuration of an example in which the signal transmission circuit according to the eleventh embodiment is applied to an overcurrent protective device 11A. With reference to FIG. 33, in overcurrent protective device 11A, control circuit 514A includes a detector 532 and a controller 533. The remainder in configuration of overcurrent protective device 11A is similar to a corresponding portion of signal transmission circuit 11, and accordingly will not be described repeatedly in detail.

Detector 532 is connected to the drain of first switch 511 and the source of first switch 511. Detector 532 detects a current flowing through first switch 511, based on a drain-source voltage of first switch 511.

Based on a comparison of the detected current with a prescribed threshold value, detector 532 determines whether an overcurrent is generated, and accordingly outputs a determination signal to controller 533.

In response to the result detected by detector 532, controller 533 outputs control signal EN1. More specifically, controller 533 does not output control signal EN1 to drive circuit 515 and third switch 513 when an overcurrent is generated, and controller 533 outputs control signal EN1 when no overcurrent is generated. Furthermore, after controller 533 turns off first switch 511 and a prescribed period of time subsequently elapses, controller 533 may return first switch 511 to the electrical conduction state.

Thus, when an overcurrent is generated and accordingly control circuit 514 stops outputting control signal EN1 and therewhile a noise or the like causes first switch 511 to erroneously operate and thus conduct, overcurrent protective device 11A can cause second switch 512 to conduct by output voltage Vout and decrease voltage V1. Thus, transmission of voltage from input terminal 502 to output terminal 503 can be maintained at low voltage.

Thus, the signal transmission circuit and overcurrent protective device according to the eleventh embodiment, do not have a pull down resistor for decreasing a switch's gate voltage. Accordingly, the signal transmission circuit and overcurrent protective device according to the eleventh embodiment can achieve both suppression of an erroneous operation of a load due to erroneous transmission of a signal resulting from a high temperature leakage current, a noise or the like, and reduction of power consumption.

While the present invention has been described in embodiments, it should be understood that the embodiments disclosed herein have been described for the purpose of illustration only and in a non-restrictive manner in any respect. The scope of the present invention is defined by the terms of the claims, and is intended to include any modifications within the meaning and scope equivalent to the terms of the claims.

What is claimed is:

1. An overcurrent protective device comprising:
   an input terminal configured to receive a power supply voltage;
   an output terminal;
   a switch provided between the input terminal and the output terminal;
   a detector configured to output a limitation signal without delay when a current flowing through the switch exceeds a prescribed tolerance value; and
   a controller configured to receive the limitation signal and control the switch to prevent the current from exceeding the tolerance value, the detector being configured to output a turn-off signal to the controller when a first state continues for a delay time determined depending on the current's magnitude, the first state being a state where the current is smaller than the tolerance value and the current exceeds a first threshold value smaller than the tolerance value, the controller turning off the switch in response to the turn-off signal.

2. The overcurrent protective device according to claim 1, wherein: the detector outputs the turn-off signal when the first state continues for a first delay time; and the detector outputs the turn-off signal when a second state continues for a second delay time shorter than the first delay time, the second state being a state where the current is smaller than the tolerance value and the current exceeds a second threshold value larger than the first threshold value and smaller than the tolerance value.

3. The overcurrent protective device according to claim 1, wherein: the controller is configured to return the switch to a conducting state when a prescribed period of time elapses from turning off the switch in response to the turn-off signal.

4. The overcurrent protective device according to claim 1 further comprising an adjustment unit configured to adjust the delay time.

5. The overcurrent protective device according to claim 4, wherein the adjustment unit sets the delay time to be shorter as the current increases.

6. The overcurrent protective device according to claim 4, wherein the adjustment unit sets the delay time to be shorter as the switch's temperature increases.

7. The overcurrent protective device according to claim 1, wherein: the detector includes a capacitor and a resistor; the delay time increases as the capacitor's capacitance value or the resistor's resistance value increases; and at least one of the capacitor and the resistor is attachable from outside the overcurrent protective device.

8. An overcurrent protective device comprising:
an input terminal configured to receive a power supply voltage;
an output terminal; a switch provided between the input terminal and the output terminal;
a detector configured to output a turn-off signal when a specific state continues for a delay time determined depending on the current's magnitude,
the specific state being a state in which a current flowing through the switch exceeds a first threshold value;
a controller configured to turn off the switch in response to the turn-off signal; and
an adjustment unit configured to adjust the delay time,
wherein the adjustment unit sets the delay time to be shorter as the switch's temperature increases.

9. The overcurrent protective device according to claim 8, wherein: the detector outputs the turn-off signal when the specific state continues for a first delay time; and
the detector outputs the turn-off signal when a state where the current exceeds a second threshold value larger than the first threshold value continues for a second delay time shorter than the first delay time.

10. The overcurrent protective device according to claim 8, wherein the controller is configured to return the switch to a conducting state when a prescribed period of time elapses from turning off the switch in response to the turn-off signal.

11. The overcurrent protective device according to claim 8, wherein the adjustment unit sets the delay time to be shorter as the current increases.

12. The overcurrent protective device according to claim 8, wherein:
the detector includes a capacitor and a resistor; the delay time increases as the capacitor's capacitance value or the resistor's resistance value increases; and
at least one of the capacitor and the resistor is attachable from outside the overcurrent protective device.

13. An overcurrent protective device comprising:
an input terminal configured to receive a power supply voltage;
an output terminal;
a switch provided between the input terminal and the output terminal and configured to switch between supply and interruption of electric power from the input terminal to the output terminal;
a control device configured to turn off the switch when a current flowing through the switch exceeds a prescribed threshold value; and
a bias circuit configured to supply an intermediate voltage between the power supply voltage and a ground voltage to the control device,
wherein the bias circuit includes a clamping circuit configured to clamp the power supply voltage to the intermediate voltage, the clamping circuit including:
a current mirror connected between a ground and the input terminal, the current mirror including a first switch and a second switch;
a zener diode having a cathode connected to the input terminal and an anode connected to the first switch;
a first resistor connected between the input terminal and the second switch; and
a second resistor connected between a ground and the first switch.

14. The overcurrent protective device according to claim 13, wherein the bias circuit includes a voltage conversion circuit configured to lower the power supply voltage to the intermediate voltage.

15. The overcurrent protective device according to claim 13, wherein the control device includes:
an overcurrent detector configured to detect whether the current flowing through the switch exceeds the threshold value;
a protective operation controller configured to generate a drive signal based on a first signal from the overcurrent detector; and
a driver configured to drive the switch in response to the drive signal from the protective operation controller, the intermediate voltage from the bias circuit being supplied to the overcurrent detector, the control device further including a level shifter configured to convert a voltage of the first signal.

16. An electronic apparatus having the overcurrent protective device according to claim 13 mounted therein.

17. An integrated circuit having the overcurrent protective device according to claim 13 integrated therewith.

* * * * *